(12) United States Patent
Bray et al.

(10) Patent No.: US 6,468,642 B1
(45) Date of Patent: *Oct. 22, 2002

(54) FLUORINE-DOPED DIAMOND-LIKE COATINGS

(75) Inventors: Donald J. Bray, East Amherst, NY (US); Chandra Venkatraman, Williamsville, NY (US); Craig A. Outten, Buffalo, NY (US); Christopher Halter, Hamburg, NY (US); Arvind Goel, Philadelphia, PA (US)

(73) Assignee: N.V. Bekaert S.A. (BE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/204,441

(22) Filed: Dec. 2, 1998

Related U.S. Application Data

(63) Continuation-in-part of application No. 09/133,951, filed on Aug. 14, 1998, now abandoned, which is a continuation of application No. 08/538,731, filed on Oct. 3, 1995, now Pat. No. 5,795,648.
(60) Provisional application No. 60/067,567, filed on Dec. 5, 1997, and provisional application No. 60/067,750, filed on Dec. 5, 1997.

(51) Int. Cl.⁷ .................................................. B32B 9/00
(52) U.S. Cl. ...................... 428/216; 428/336; 428/408; 428/457
(58) Field of Search ................. 428/408, 336, 428/457, 216

(56) References Cited

U.S. PATENT DOCUMENTS

| 4,191,735 A | 3/1980 | Nelson et al. |
| 4,597,844 A | * 7/1986 | Hiraki et al. ............... 204/192 |
| 4,783,361 A | * 11/1988 | Oshinsky et al. ........... 428/217 |
| 4,783,368 A | 11/1988 | Yamamoto et al. |
| 4,816,291 A | 3/1989 | Desphandey et al. |
| 4,822,466 A | 4/1989 | Rabalais et al. |
| 4,842,937 A | 6/1989 | Meyer et al. |
| 4,877,677 A | 10/1989 | Hirochi et al. |
| 4,897,829 A | 1/1990 | Ikoma et al. |
| 4,915,977 A | 4/1990 | Okamoto et al. |
| 4,925,701 A | 5/1990 | Jansen et al. |
| 4,933,058 A | 6/1990 | Bache et al. |
| 4,948,388 A | 8/1990 | Ringwood |
| 4,960,643 A | 10/1990 | Lemelson |

(List continued on next page.)

FOREIGN PATENT DOCUMENTS

GB 2 158 086 A 3/1985

OTHER PUBLICATIONS

Dorfman, "Diamond–Like Nanocomposites (DLN)", Thin Solid Films, 267–273:212 (1992).

(List continued on next page.)

*Primary Examiner*—Archene Turner
(74) *Attorney, Agent, or Firm*—Braman & Rogalskyj, LLP

(57) ABSTRACT

The invention relates to fluorine-doped coatings which include a diamond-like composition containing carbon, silicon, oxygen, hydrogen, and fluorine on various substrates. Preferred substrates include flexible substrates, precision-edged substrates, and electrosurgical instruments. The present invention also relates to a method of making a substrate coated with a fluorine-doped diamond-like coating which includes positioning the substrate in a vacuum coating chamber and depositing a diamond-like composition containing carbon, silicon, oxygen, hydrogen, and fluorine onto the substrate by co-deposition of clusterless particle beams comprised of ions, atoms, or radicals of the carbon, silicon, oxygen, hydrogen, and fluorine, the mean free path of each particle species being in excess of the distance between its source and the growing particle coating surface of the substrate.

61 Claims, 8 Drawing Sheets

U.S. PATENT DOCUMENTS

| | | |
|---|---|---|
| 4,961,958 A | 10/1990 | Desphandey et al. |
| 4,980,021 A | 12/1990 | Kitamura et al. |
| 4,985,051 A | 1/1991 | Ringwood |
| 4,992,298 A | 2/1991 | Deutchman et al. |
| 5,002,899 A | 3/1991 | Geis et al. |
| 5,032,243 A | 7/1991 | Bache et al. |
| 5,040,501 A | 8/1991 | Lemelson |
| 5,055,318 A | 10/1991 | Deutchman et al. |
| 5,064,801 A | 11/1991 | Juntgen et al. |
| 5,068,148 A | 11/1991 | Nakahara et al. |
| 5,077,103 A | 12/1991 | Wagner et al. |
| 5,087,434 A | 2/1992 | Frenklach et al. |
| 5,094,915 A | 3/1992 | Subramaniam |
| 5,100,424 A | 3/1992 | Jang et al. |
| 5,101,288 A | 3/1992 | Ohta et al. |
| 5,110,577 A | 5/1992 | Tamor et al. |
| 5,117,299 A | 5/1992 | Kondo et al. |
| 5,135,808 A | 8/1992 | Kimock et al. |
| 5,137,784 A | 8/1992 | Suzuki et al. |
| 5,142,390 A | 8/1992 | Ohta et al. |
| 5,142,785 A | 9/1992 | Grewal et al. |
| 5,158,828 A | 10/1992 | Sudani et al. |
| 5,169,579 A | 12/1992 | Marcus et al. |
| 5,171,732 A | 12/1992 | Hed |
| 5,174,983 A | 12/1992 | Snail |
| 5,183,602 A | 2/1993 | Raj et al. |
| 5,190,807 A | 3/1993 | Kimock et al. |
| 5,198,285 A | 3/1993 | Arai et al. |
| 5,202,571 A | 4/1993 | Hirabayashi et al. |
| 5,206,083 A | 4/1993 | Raj et al. |
| 5,210,430 A | 5/1993 | Taniguchi et al. |
| 5,219,769 A | 6/1993 | Yonehara et al. |
| 5,232,568 A | 8/1993 | Parent et al. |
| 5,243,199 A | 9/1993 | Shiomi et al. |
| 5,249,554 A | 10/1993 | Tamor et al. |
| 5,256,483 A | 10/1993 | Yamazaki et al. |
| 5,266,409 A * | 11/1993 | Schmidt et al. ............. 428/408 |
| 5,295,305 A | 3/1994 | Hahn et al. |
| 5,352,493 A | 10/1994 | Dorfman et al. |
| 5,378,527 A * | 1/1995 | Nakanishi et al. .......... 428/408 |
| 5,466,431 A | 11/1995 | Dorfman et al. |
| 5,618,619 A * | 4/1997 | Petrmichl et al. ........... 428/447 |
| 5,638,251 A | 6/1997 | Goel et al. |
| 5,665,326 A | 9/1997 | Goel et al. |
| 5,693,305 A | 12/1997 | Revankar et al. |
| 5,718,976 A | 2/1998 | Dorfman et al. |
| 5,728,465 A | 3/1998 | Dorfman et al. |
| 5,786,068 A | 7/1998 | Dorfman et al. |
| 5,795,648 A | 8/1998 | Goel et al. |

OTHER PUBLICATIONS

R. d'Agostino, ed., "Plasma Deposition, Treatment and Etching of Polymers", Academic Press, San Diego, 1990.

Dorfman, V.F., et al., Sov. Phys. Dokl., 28 (1983) 743 (English Abstract).

Dorfman, V., "Synthetics of Solid State Structure", Metallurgia, Moscow (1986).

Dorfman, V., et al. Diamond Films, '90, Proc. 1st European Conf. on Diamond and Diamond–Like Carbon Coatings, Crans–Montana (1990).

Weissmantel et al. J. Vac. Sci. Technol. vol. A4, 2892.

Dorfman, et al. J. Tech. Phys. Lett., 14:1033 (1988).

Ageev, "Light Induced Variations of Optical Properties of Diamond–Like Films", Surface and Coating Technologies, 47:269–278 (1991).

* cited by examiner

FLUORINE-DOPED DIAMOND-LIKE COATINGS

CROSS REFERENCE TO RELATED APPLICATIONS

This application is a continuation-in-part of U.S. patent application Ser. No. 09/133,951, filed Aug. 14, 1998 now abandoned, which is a continuation of U.S. patent application Ser. No. 08/538,731, filed Oct. 3, 1995 now U.S. Pat. No. 5,795,648. This application is also a continuation-in-part of U.S. Provisional Patent Application Serial No. 60/067,567, filed Dec. 5, 1997 and U.S. Provisional Patent Application Serial No. 60/067,750, filed Dec. 5, 1997.

FIELD OF THE INVENTION

The present invention relates to fluorine-doped diamond-like coatings on substrates and, more particularly, to such coatings on flexible substrates, precision-edged substrates, and electrosurgical instruments.

BACKGROUND OF THE INVENTION

The preservation of sharp edges is important for many products and industries. Many industrial blades and medical tools are only useful if their sharp edges can be maintained for reasonably long periods of time. The sharpness is the result of the precision of the edge formed by the substrate and any coatings thereon. Razor blades, for example, have an edge formed by producing a radius of curvature at the blade's extreme tip from about 75 to about 1000 angstroms. For comparison, a human hair has a width of about 100 micrometers. Such precise substrate edges are often coated to preserve the precision of the edge by attempting to inhibit its degradation.

Precision edge degradation can be caused by corrosive and/or erosive forces. Razor blades, for example, dull quite easily; to an extent, immediately upon first use. Steel used for razor blades is therefore often coated first with a sputtered metal coating, followed by a coating of polytetrafluoroethylene (PTFE). While the PTFE coating is usually tens to thousands of angstroms thick, it is substantially removed from the blade upon first use. Enough PTFE survives to provide a measure of continued lubrication. However, the PTFE coatings do not prevent the degradation of the precision edge.

Dulling of precision edges may be due to an increase in the radius of curvature at the blade's extreme tip, cracks, chips or breaks at the edge causing a jagged edge, erosion of edge material, or a combination of these factors. For razor blades, the degradation of the precision edge causes increased friction and user discomfort. The blade is then replaced, or if a part of a disposable implement, the entire razor is discarded. For more expensive cutting implements in industrial or medical fields, etc., the dulling of precision-edged tools results in the need for sharpening or re-edging, which increases costs.

The depositing of harder material coatings has been tried in an attempt to preserve edge integrity. For many applications, the coating should also have excellent thermal stability; i.e., be able to withstand extreme heat, as from use itself (saw blade) or from sterilization procedures (autoclaving surgical tools).

Metal-based coatings such as steel, zinc, aluminum, chromium, nickel, cadmium, tantalum, palladium, boron, silicon, copper, gallium, rhenium, and alloys thereof, have demonstrated precision edge preservation and are used in many industries to provide protective coatings for sharp edges. However, coatings made from these materials are generally suitable only for metallic substrates.

Silicate based coatings are known to be resistant to air, acid, alkali, and gases at elevated temperatures. However, coatings made from silicates are not particularly strong materials and would not provide appropriate protection for precision edges.

Certain ceramic materials have good corrosion resistance and could conceivably be used as edge-preserving coatings. However, ceramics are brittle and subject to thermal shock failure. They are typically rough and porous and would not provide the desired low friction.

Certain hard diamond-like coatings (DLCs), have been tried. However, a coating must not only be hard, it must have excellent adherence to the substrate. Known DLCs often require an interlayer to adhere them to a substrate. For some articles, such an interlayer may not pose a problem. However, to preserve a precision edge, the total thickness of all coatings must not appreciably increase the radius of curvature at the extreme tip of the edge, which is very small. Further, the additional process of depositing interlayers between the DLC and the substrate increases the production cost. This can be significant, and even economically unsound for low cost items, such as disposable razors and razor blades.

Therefore, a strong, hard, highly adherent, temperature, pH and chemical insensitive coating that can be applied to both metal and non-metal surfaces to preserve precision edges without applying interlayers, would be highly desirable.

It is also desirable to provide many types of articles, such as cookware, industrial tools, or medical tools, with a release or non-stick coating so that sticky residues can be removed easily as the article is cleaned. Non-stick coatings include, for examples, fluorocarbon resins such as polytetrafluoroethylene or silicon resins.

Articles typically having a non-stick coating include electrosurgical blades. In electrosurgical procedures, an electrosurgical instrument is energized by a radio frequency voltage for cutting tissue and/or coagulating blood through cauterization. Such instruments commonly incorporate a conductive blade in either a monopolar or bipolar system. Although the electrosurgical instruments have proved effective for controlling bleeding during surgery, a common problem with the instruments is tissue sticking to the cutting surface and, consequently, a reduction in cutting efficiency that requires early replacement of the cutting element. One approach to this problem has been to coat the cutting element with a non-stick material to which cauterized tissue is less likely to adhere. Of course, such coating material must be suitable for passing electrosurgical current or at least the coating must be arranged to allow passage of current from the cutting surface to the tissue.

Although the coating of electrosurgical instruments with non-stick materials has improved the efficiency of surgical procedures, the known coating materials have numerous deficiencies. For instance, the coatings have unsatisfactory electrical conductivity, adhere poorly to the substrate, tend to degrade under the conditions used during surgery, and undergo surface corrosion and pitting as a result of repeated sterilization cycles.

Also, there is an increasing need for integrating passive and active devices such as resistors or capacitors on flexible substrates. The use of interconnect technology with discrete components is not amenable for multilayering, high cost assembly, unfavorable size to weight ratio, large equipment cost and multiple processing steps. Use of thin film passives resistors and capacitors excludes the requirement for solder interconnects, facilitates integration with multilayering capability and excellent size to weight ratio. Thus, use of thin dielectric coatings on flexible substrates like polyimides or high temperature polymers is becoming important. The use of integrated resistors and capacitors in Multi-layer Chip Module (MCM) and FLEX circuitry is one area for use of coatings on flexible substrates. A coating that can be used with any MCM technology including flip chip, surface mount or direct chip attach is desirable.

Presently, resistors and capacitors are made as discrete components and mounted by solder and wire bonding. This involves high cost assembly, costly equipment for bonding an soldering, unfavorable size to weight ratio and incompatibility to building multi-layered circuitry. The present invention is directed to overcoming these deficiencies.

SUMMARY OF THE INVENTION

The present invention is directed to an article including a substrate coated with a fluorine-doped diamond-like coating, wherein the coating includes a diamond-like composition containing carbon, silicon, oxygen, hydrogen, and fluorine In one embodiment, the invention relates to a flexible substrate coated with a fluorine-doped diamond-like coating. The coating contains carbon, silicon, oxygen, hydrogen, and fluorine, and is preferably coated to a thickness of about 0.05 micron to about 10 microns.

In another embodiment, the invention relates to a precision-edged substrate coated with a fluorine-doped diamond-like coating containing carbon, silicon, oxygen, hydrogen, and fluorine.

In yet another embodiment, the invention relates to an electrosurgical instrument coated with a fluorine-doped diamond-like coating. The coating contains carbon, silicon, oxygen, hydrogen, and fluorine.

In a further embodiment, the invention relates to a substrate coated with a fluorine-doped diamond-like coating which contains carbon, silicon, oxygen, hydrogen, fluorine, and an additional dopant.

The present invention further relates to a method of making an article comprising a substrate coated with a fluorine-doped diamond-like coating which includes positioning the substrate in a vacuum deposition chamber and depositing a diamond-like composition containing carbon, silicon, oxygen, hydrogen, and fluorine onto the substrate by co-deposition of clusterless particle beams comprised of ions, atoms, or radicals of the carbon, silicon, oxygen, hydrogen, and fluorine. The mean free path of each particle species is in excess of the distance between its source and the growing particle coating surface of the substrate.

DETAILED DESCRIPTION OF THE INVENTION

Figure 1:
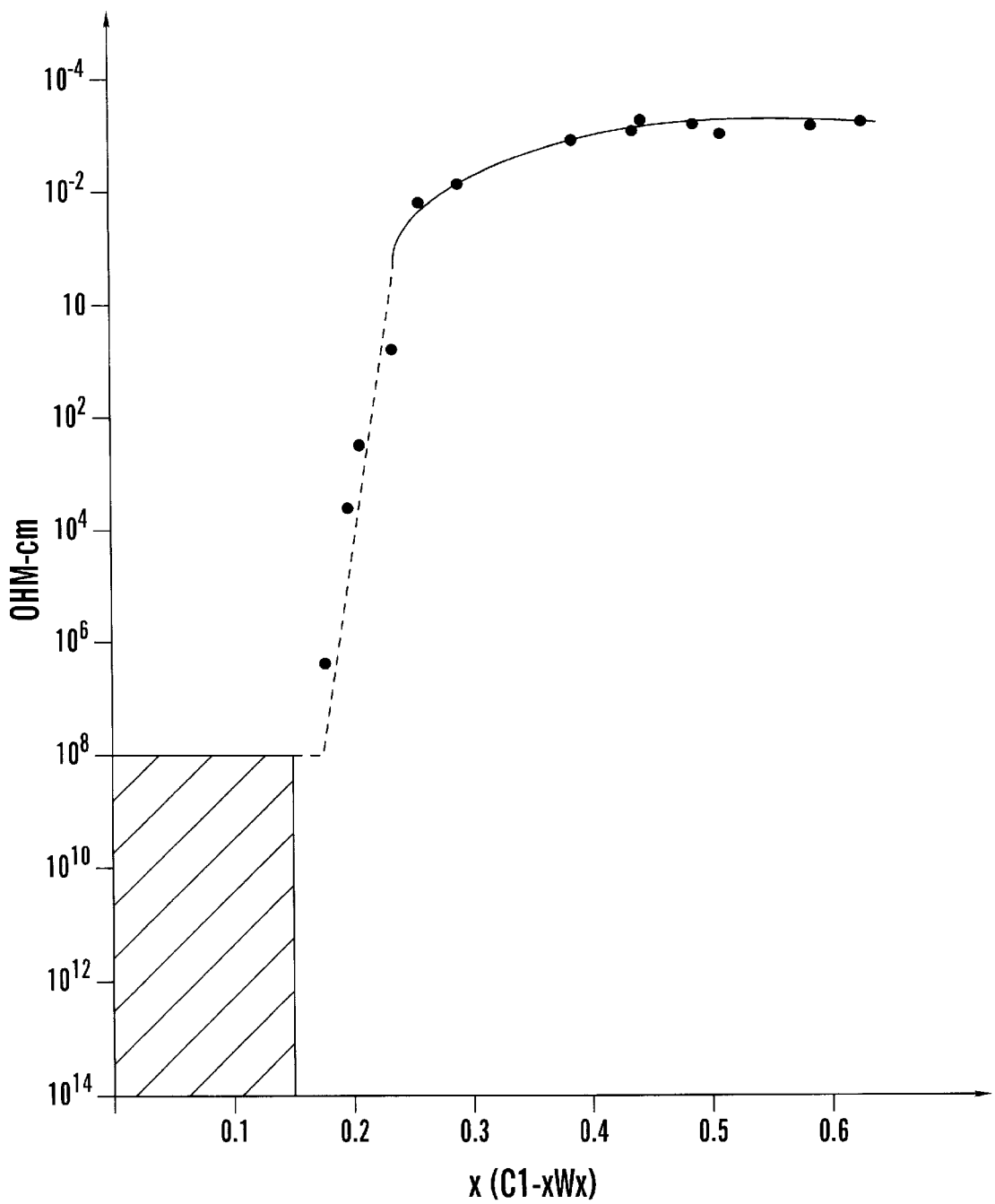
FIG. 1 is a schematic diagram showing the dependence of electrical resistivity on concentration for the case of a metal-doped coating of the present invention.
Figure 2:
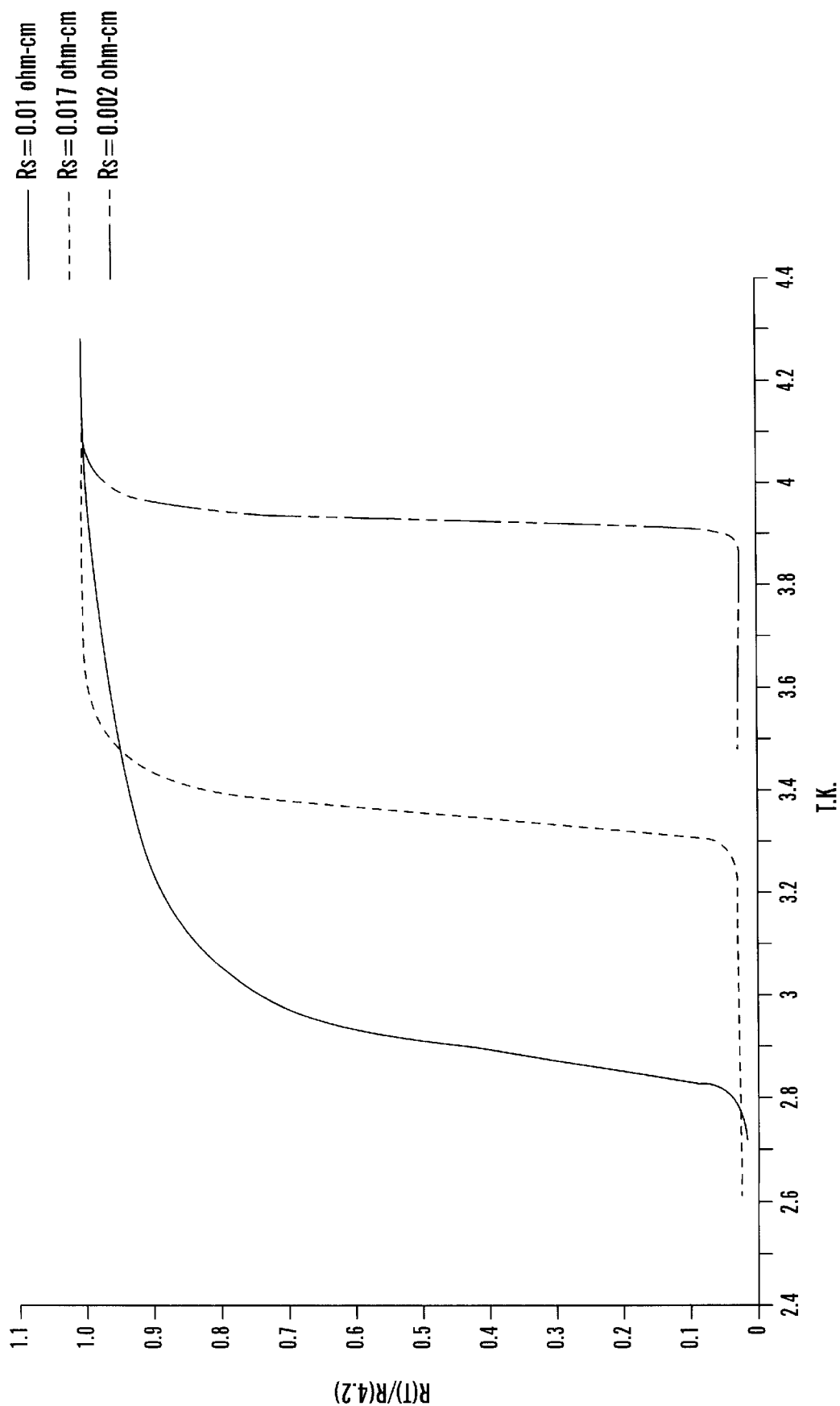
FIG. 2 is a schematic diagram showing the dependence of electrical resistivity on temperature for a metal-doped coating of the present invention.

The present invention is directed to articles that comprise substrates coated with fluorine-doped diamond-like coatings. The coatings of the present invention contain carbon, silicon, hydrogen, oxygen, and fluorine. The coatings may be deposited on a variety of substrates, including flexible substrates, precision-edged substrates, and electrosurgical instruments with excellent adhesion and low film stress. The coatings are resistant to corrosion and erosion. They are extremely hard and long lasting. They preserve precision-edges and can be electrically "tuned" or altered as desired by manipulating the chemical composition, to obtain the best combination of properties for a particular application.

As used herein and as commonly understood, a "precision edge" is the area of ultimate narrowing of a substrate, resulting in the convergence of two sides of the substrate to achieve a small radius of curvature at a tip. A small radius of curvature is understood to be one of from about 25 angstroms up to several microns. For very sharp blades, the radius of curvature is from about 75 angstroms to about 1000 angstroms. For other less sharp cutting tools, the radius at the tip may be up to hundreds of microns, while still being considered a precision edge.

Corrosion is defined as the electrochemical degradation of metals or alloys due to reaction with their environment, which is accelerated by the presence of acids or bases. In general, the corrodibility of a metal or alloy depends upon its position in the activity series. Corrosion products often take the form of metallic oxides or halides. In addition, corrosion may be considered to be the degradation of non-metal substrates by exposure to natural environmental conditions as well as exposure to organic materials.

In addition to the edge-preserving and corrosion-resistant properties of the coatings of the present invention, the coatings are strong and are resistant to erosion caused by chemicals, abrasion, or ablation while also being thermally stable. The coatings would therefore be impervious to biological or chemical attack. The resistance of the coatings of the present invention to erosion, reduces the possibility of, for example, physical chipping. Hence the substrate is less likely to be exposed to environmental corrosion. The coatings have excellent adherence to various substrates and are resistant to thermal shock at elevated temperatures beyond those known to erode known diamond-like coatings.

One preferred coating of the invention comprises a carbon network chemically stabilized by hydrogen atoms, and a glass-like silicon network stabilized by oxygen atoms resulting in an amorphous structure. Although not meaning to be bound by theory, the fluorine is believed to be substitutionally incorporated, replacing a portion of either hydrogen or silicon. "Amorphous" as used herein refers to a random structure or arrangement of atoms in a solid state that results in no long range regular ordering, and lacks crystallinity or granularity. Such coatings contain no clusters or ordering greater than about 10 Angstroms. This absence of clusters at the atomic scale is a key characteristic of the coatings of the present invention. Clusters can destroy the amorphous nature of the structure, and can serve as active centers of degradation.

The fluorine-doped diamond-like coatings of the present invention are dielectric; however, depending on the required electrical resistivity in a particular application, the preferred coatings may contain one or more dopants in addition to fluorine, designed to tailor and tune the resistivity. Therefore, the present invention also relates to a fluorine-doped diamond-like coating which includes fluorine, carbon, silicon, oxygen, hydrogen, and an additional dopant.

The additional dopants may be any one, or a combination of, transition metals and non-metals of the groups Ib–VIIb and VIII of the periodic table. Further, silicon and oxygen atoms may also be used in the dopant networks with other elements and compounds.

Although conductive films are preferred, non-metal dopants may be incorporated as the optionally present dopant. Furthermore, when dielectric coatings are desired, non-conductive dopants may also be incorporated. These may include conductive elements which are reacted to yield a non-conductive compound. When conductive coatings are desired, conductive elements and compounds may be used as the dopants.

Therefore, in accordance with the invention, a preferred coating can comprise a C—F/H network, a glass-like Si—O network, and, optionally, an additional dopant network. The random interpenetrating of the two or three networks is believed to provide the uniform strength of the structures in all directions found in the fluorine-doped diamond-like coatings of the invention. The structures are free of micropores even at thicknesses of about 80 Angstroms (8 nm). The fluorine-doped diamond-like coatings are therefore extremely stable and possess unique combinations of chemical, mechanical, electronic, and superconducting properties. Carbide formation can be prevented even at metal concentrations as high as 50% (verified using Auger electron spectroscopy, electron spectroscopy for chemical analysis (ESCA), extended x-ray absorption fine structure spectroscopy (EXAFS) and Fourier transform infrared spectroscopy (FTIR)). Again, the properties of these coatings can be varied over wide ranges depending on the dopant and the concentration selected, as well as the deposition technique and parameters. As already mentioned, the structure of the coatings can be tailored at the molecular level. Therefore, unique electrical, optical, and other desirable solid state properties with desired mechanical strength, hardness and chemical resistance can be imparted to the coatings.

For flexible substrates, preferred additional dopant elements, if desired, are B, Si, Ge, Te, O, Mo, W, Ta, Nb, Pd, Ir, Pt, V, Fe, Co, Mg, Mn, Ni, Ti, Zr, Cr, Re, Hf, Cu, Al, N, Ag and Au; with Ti and W being preferred.

For precision-edged substrates, preferred additional dopant elements, which are particularly effective for corrosion-resistant, metal-doped coatings, are B, Si, Ge, Te, O, Mo, W, Ta, Nb, Pd, Ir, Pt, V, Fe, Co, Mg, Mn, Ni, Ti, Zr, Cr, Re, Hf, Cu, Al, N, Ag and Au; with W, Cr, Zr, Ti and Hf being preferred. Preferred compounds which may be used as dopants include TiN, BN, AlN, ZrN and CrN; with TiN and ZrN being most preferred.

For electrosurgical instruments, preferred additional dopant elements are B, Li, Na, Si, Ge, Te, O, Mo, W, Ta, Nb, Pd, Ir, Pt, V, Fe, Co, Mg, Mn, Ni, Ti, Zr, Cr, Re, Hf. Cu. Al, N, Ag and Au; with W, Cr, Zr, Ti and Hf being most preferred. Preferred dopant compounds include TiN, BN, AlN, ZrN and CrN; with TiN, AlN and CrN being most preferred.

The electrical properties of the fluorine-doped diamond-like coatings can be varied to give optimal resistivities from about $10^{-2}$ to about $10^{15}$ ohm-cm, while preserving the properties of the coating. A transition to a superconducting state, with the absence of electrical resistivity, is observed at low temperatures for certain three-network nanocomposite networks.

Preferably, the carbon content of the fluorine-doped diamond-like coating is greater than about 40 atomic % of the coating, e.g. from about 40 to about 98 atomic %, and more preferably from about 50 to about 98 atomic %. The fluorine content of the fluorine-doped diamond-like coatings is preferably at least about 1 atomic % up to about 40 atomic % of the carbon concentration. Although such coatings may theoretically be prepared without any hydrogen, the hydrogen content is preferably at least about 1 atomic % up to about 40 atomic % of the carbon concentration. The sum of the silicon, oxygen and dopants, if present, is greater than about 2 atomic % of the coating composition. In one preferred embodiment, the ratio of carbon to silicon atoms is from about 4:1 to about 9:1, carbon to fluorine atoms is from about 1.1:1 to about 2.5:1, carbon to hydrogen atoms is from about 1.1:1 to about 2.5:1, silicon to oxygen atoms is about 0.6:1 to about 1.7:1, and dopant to carbon atoms is about 0:1 to about 1.5:1. This embodiment is preferred for flexible substrates. In another preferred embodiment, the ratio of carbon to silicon atoms is from about 2:1 to about 8:1, hydrogen to carbon atoms is about 0.01:1 to about 0.4:1, and the silicon to oxygen atoms is about 0.5:1 to about 3:1, and dopant to carbon atoms is about 0.1:1 to about 1.5:1. Therefore, in the coating, for every 1 part carbon, there is from about 0.01 to about 0.4 parts hydrogen, from about 0.125 to about 0.5 parts silicon, and from about 0.0375 to about 1.0 parts oxygen. In such a composition, if a dopant is present, for every 1 part carbon, there will be from about 0.01 to about 1.5 parts dopant, depending upon the desired characteristics to be imparted to the metal-doped coating. This embodiment is preferred for precision-edged substrates and electrosurgical instruments.

The density of the fluorine-doped diamond-like coating varies from about 1.8 to about 2.1 g/cm$^3$. The rest of the space is taken up by a random network of nanopores with diameters varying from about 0.28 to about 0.35 nm. The nanopore network does not form clusters or micropores. The properties of the fluorine-doped diamond-like coating may then be tailored by adding dopant. The dopants fill the nanopore network in a random fashion, eventually resulting, at a certain dopant concentration, in an additional network without clusters or microcrystalline grains, even at concentrations as high as 50 atomic %. At concentrations below about 10 atomic %, the dopants are distributed as separate atoms in the nanopores of the diamond-like matrix. The average distance between dopant atoms in this quasi-random structure can be controlled by the concentration of the dopant. When the relative concentration of the dopant element or compound reaches about 20–25 atomic %, the dopants form the third network in the fluorine-doped diamond-like coating.

The fluorine-doped diamond-like coatings of the present invention are especially useful for making resistors and capacitors on flexible substrates. The coatings not only can be integrated into the MCM processing, but also deliver good performance, excellent size to weight ratio, can be patterned by photolithography, and have multilayering capability. The ratios of carbon, silicon, hydrogen, oxygen, fluorine, and, optionally, an additional dopant, as well as the thickness and patterning of the coating are tailored to the particular device of interest. The coating can be deposited on a variety of flexible substrates, especially polymeric films such as hydrophilic or hydrophobic thermoplastic polymers preferably with a Tg greater than about 100° C., most preferably with a Tg greater than about 150° C., with excellent adhesion and low film stress. Preferably, the polymeric film is selected from the group consisting of polyimides, polyesters, polythermides, polyamide-imides, polyethylene terephthalates, Kapton® (DuPont, Wilmington, Del.), Mylar® (DuPont, Wilmington, Del.), Ultem® (General Electric Co., Pittsfield, Mass.), and Torlon® (Amoco Performance Products, Alpharetta, Ga.). The ability to tailor the amount of metal dopant and fluorine content in the diamond-like coatings, makes it possible to compatibly coat a variety of flexible substrate materials.

Figure 9:
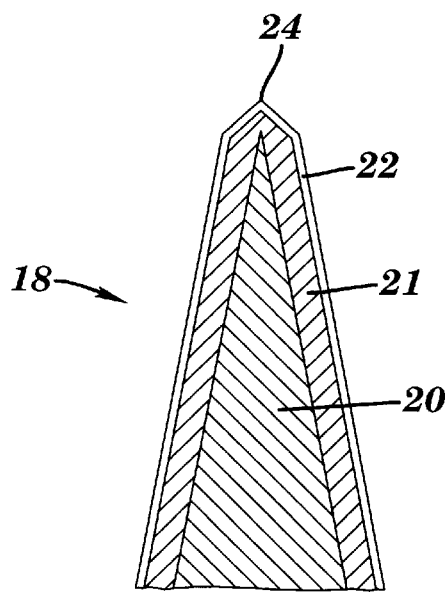
FIG. 9 is an enlarged cross-section view of a razor blade having a coating of the present invention.

The fluorine-doped diamond-like coatings of the present invention are also especially useful as a coating for precision-edged instruments, such as razor blades. In one embodiment, FIG. 9 shows an enlarged cross-sectional view of a razor blade 18 with a precision-edged tip 24 coated with the fluorine-doped diamond-like coating of the present invention. In FIG. 9, substrate 20, namely, a steel razor blade, is coated with a layer of fluorine-doped diamond-like coating 21. A thin coating of polytetrafluoroethylene (PTFE) 22 is deposited on the fluorine-doped diamond-like coating 21.

Figure 10:
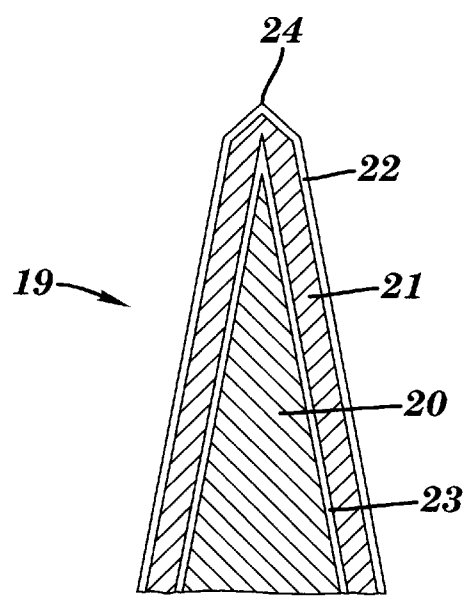
FIG. 10 is an enlarged cross-section view of a razor blade having a coating of the present invention and an interlayer.

FIG. 10 shows a coated blade 19 with a precision-edged tip 24 comprising a substrate 20 that has been coated with an interlayer 23. The interlayer 23 is then coated with the fluorine-doped diamond-like coating 21, which is finally coated with the PTFE coating 22. The interlayer is a thin layer of material selected from silicon, silicon carbide, vanadium, tantalum, niobium, molybdenum and alloys thereof, alone or in combination with one another. The interlayers are deposited to a thickness of from about 50 to about 500 angstroms. The PTFE is deposited to a thickness of from about 10 angstroms to about 1000 angstroms, preferably from about 25 to about 75 angstroms.

Figure 11:
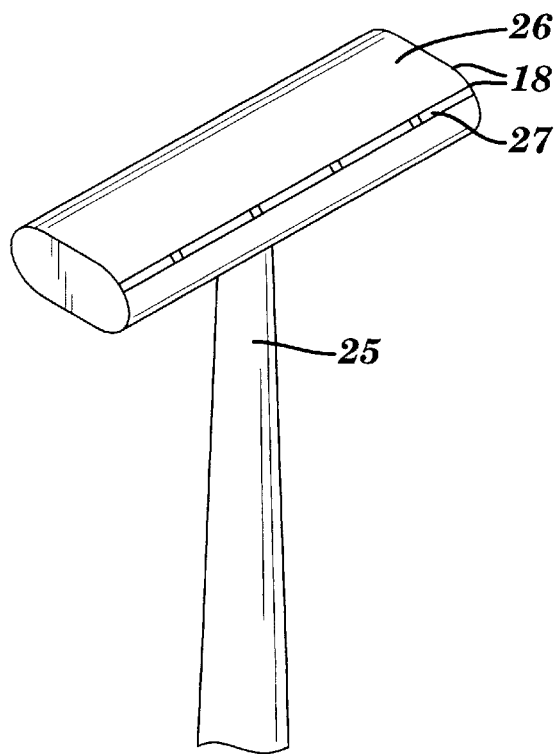
FIG. 11 is perspective view of a razor having fluorine-doped diamond-like-coated razor blades incorporated into the head.

In one embodiment, the blades may be assembled into a razor. FIG. 11 shows the blades 18 of FIG. 9 engaged in the head assembly 26 of a disposable razor 25. An opening 27 in the head allows debris to pass from the shaving plane. It is therefore understood that the fluorine-doped diamond-like coated blades of the present invention may be manufactured as blades, such as replacement double-edged or single-edged blades, or may be incorporated into razor assemblies.

Many uses for the precision edge-preserving fluorine-doped diamond-like coatings of the present invention exist, including but not limited to the coating of metals and non-metals, surgical instruments, razor blades, industrial and non-industrial tools, cutlery, knives, pocket knives, and any precision-edged substrates which are vulnerable to corrosive and/or erosive attack, and dulling.

Further, the fluorine-doped diamond-like coatings of the present invention are especially useful as a coating for electrosurgical instruments, such as electrosurgical blades as described in U.S. Pat. Nos. 5,197,962 and 5,549,604, which are hereby incorporated by reference.

In addition, the fluorine-doped diamond-like coatings may be used to coat other devices, such as bipolar forceps, laparoscopic instruments, dental brackets, and biomedical devices, such as catheters.

It is contemplated that single layers or multiple layers of the identical or differing (based on chemical content) fluorine-doped diamond-like coatings may be used to give the desired physical properties. For example, fluorine-doped diamond-like coatings may be layered with fluorine-doped diamond-like coatings which contain an additional dopant, either metal or nonmetal, to give the desired properties.

To improve adherence, conventional diamond like coatings ("DLC") coatings often have an interlayer between the substrate and the DLC coating. However, this interlayer limits the useful thickness of the DLC coatings. If the DLC coatings are too thick, delamination occurs. Surprisingly, with the fluorine-doped diamond-like coatings of the present invention, adherence is so good that an interlayer is not required. As a result, the coating material may be applied more thickly without risking delamination from the substrate. The ability to apply a thicker layer of the fluorine-doped diamond-like coating results from the low intrinsic stress of the Si—O network, and is believed to contribute to the superior erosion resistance of the fluorine-doped diamond-like-coated substrates. Interlayers may be used with the fluorine-doped diamond-like coatings if desired. The tunability of the fluorine-doped diamond-like coatings also insures good adherence of the fluorine-doped diamond-like coating to the interlayer as the fluorine-doped diamond-like coating may be doped with a dopant to optimize compatibility and adherence to the interlayer as well as to the substrate. Such "tuning" is accomplished by incrementally altering the particular dopant as well as the dopant concentration. The fluorine-doped diamond-like coatings may also have their properties altered when no dopants are included. In addition to altering chemical composition, changes in properties in the fluorine-doped diamond-like coatings also can be achieved by altering the deposition conditions, including, but not limited to, temperature and pressure. The fluorine-doped diamond-like coatings, therefore, adhere well to both metal-containing and non-metal containing substrates.

In addition to excellent adherence, the coatings of the present invention, as applied to precision-edged substrates and flexible substrates, have very high dielectric strength without an additional dopant, a low dielectric constant, low surface energy, and a high water contact angle. The coatings without an additional dopant have dielectric strength exceeding 1 MV/cm and can be as high as 4 MV/cm. The coatings have a very low dielectric constant, as low as 2.5. The coatings have very low surface energy, as low as 19.6 dyne/cm. The coatings have a high water contact angle, as high as 101°. The high water angle of the coating renders the surface of the flexible substrate hydrophobic.

The coatings, as applied to flexible substrates, have excellent thermal stability in electrical characteristics. The dielectric constant of the coatings remains unchanged in the temperature range of −173° C. to 177° C. The temperature range encompasses the military temperature range of −25° C. to 125° C.

For electrosurgical instruments in accordance with the invention, the fluorine-doped diamond-like coatings preferably include an additional dopant as referred to above. Such coatings, preferably, form articles having an impedance from about 1 to about 1000 ohms, the resistivity of the coating being from about $10^{-2}$ to about $10^{15}$ ohm-cm. The coating for such instruments also, preferably, has a surface energy from about 19 to about 29 dynes/cm and, most preferably, from about 24 to about 26 dynes/cm. The water contact angle for the coating is preferably from about 80° to about 101°.

The presence of glass-like silicon stabilized by oxygen, serves to prevent the growth of graphitic carbon at high temperatures and, to prevent metal cluster formation in metal-containing coatings, as well as reducing the internal stress in the coatings, thereby enhancing the adhesion directly to substrates. This appears to lead to superior adherence of the fluorine-doped diamond-like coatings of the present invention to the substrate material.

The low intrinsic stress found in the fluorine-doped diamond-like coatings contributes to their corrosion resistance. A coating must not only be unreactive to a corrosive agent, but should also act as a barrier layer, preventing contact between the corrosive agent and the protected substrate. Conventional DLC films often possess high intrinsic stresses, and as a result suffer from pin holes and overall porosity. Due to the comparatively low stress in fluorine-doped diamond-like coatings of the invention, they are pore-free, and, therefore, resist chemical attack and permeation.

The fluorine-doped diamond-like coatings of the present invention have temperature stability far exceeding that of traditional diamond-like materials. Crystalline diamond is stable to approximately 1100° C., upon which graphitization occurs. Quartz has long term thermal stability to 1470° C., and short term thermal stability up to 1700° C. Traditional, non-alloyed diamond-like films are stable only to about 600° C. before graphitization occurs. Alloyed DLC films are much less thermally stable. By contrast, the fluorine-doped diamond-like coatings of the present invention have long term stability to 1250° C. and short term stability to 2000° C. Thus thermal stability of the coating of the present invention exceeds that of crystalline diamond while preserving the amorphous, diamond-like state.

In the range from about 600° C. to about 1000° C., the chemical bonds of the carbon matrix of fluorine-doped diamond-like coating materials partly change from $Sp^3$ to $Sp^2$. However, the general structure and their "diamond-like" properties are preserved. By contrast, under similar conditions, conventional DLC is graphitized and loses its diamond-like properties. Further, in the range of from 400° C. to 500° C. (preferably 430° C.), a reverse annealing is observed, whereby the ratio of $sp^3$ to $sp^2$ is increased. Inhibiting graphitization of the carbon is critical for preserving dielectric properties, as graphitized carbon is more conductive than DLC. Therefore, the thermal stability of the fluorine-doped diamond-like coatings gives the dielectric coatings of the invention a significant advantage over DLC coatings.

Another advantage of the fluorine-doped diamond-like coatings of the present invention is their hardness and durability. The fluorine-doped diamond-like coatings, especially the metal doped coatings, combine high microhardness with elasticity, thus the microhardness of the fluorine-doped diamond-like coatings of the present invention ranges from about 5 to about 32 GPa.

The present invention also includes a method of making a substrate coated with a fluorine-doped diamond-like coating. The method comprises positioning the substrate in a vacuum coating chamber and depositing a diamond-like composition containing carbon, silicon, oxygen, hydrogen, and fluorine onto the substrate by co-deposition of clusterless particle beams comprised of ions, atoms, or radicals of said carbon, silicon, oxygen, hydrogen, and fluorine, the mean free path of each particle species being in excess of the distance between its source and the growing particle coating surface of the substrate.

More particularly, the fluorine-doped diamond-like coatings of the present invention may be synthesized via co-deposition by clusterless beams of ions, atoms or radicals of the relevant elements, where the mean free path of each particle species exceeds the distance between its source and the growing particle coating surface, and each beam contains particles of well-defined energy. Carbon-containing particle beams can be produced by plasma discharge in a plasmatron and extracted as charged particles by a high-voltage field in a vacuum chamber and directed onto the substrate.

At least 50% of the carbon-containing particles have kinetic energy above about 100 eV. The temperature of the substrate during growth should not exceed 500° C.

Figure 5:
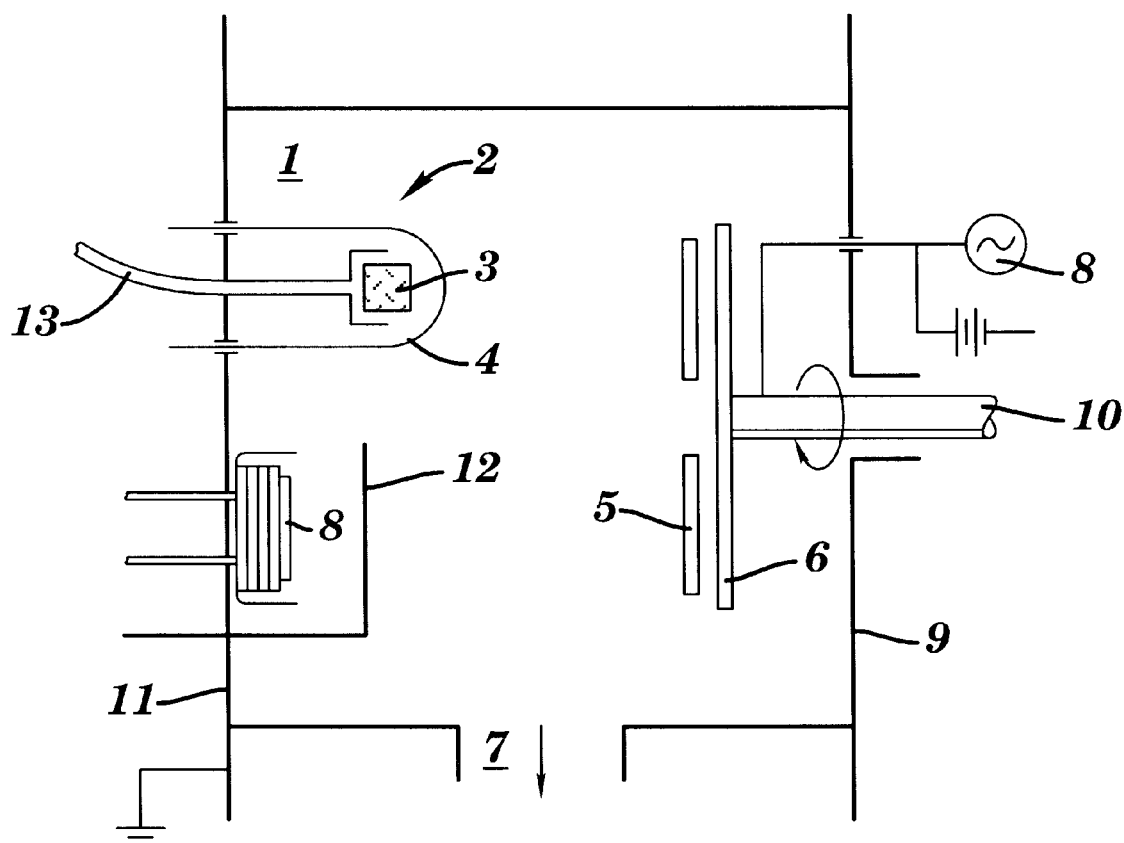
FIG. 5 is a cross section view of a preferred deposition chamber using a plasma source integrally located within the chamber.

FIG. 5 shows one preferred embodiment of the coating chamber used for the coating deposition process. A vacuum deposition chamber 1 is provided to coat a substrate sample. A precursor inlet system 13, comprises a metal tube and a porous ceramic material 3 through which a liquid precursor is injected.

The precursor is any compound useful as a precursor for C, Si, H, O, and F. Organosilicon compounds are preferred precursors for C, H, Si, O, and F. One preferred organosilicon compound is liquid polytrifluoropropylmethylsiloxane. A particularly preferred precursor is poly-3,3,3-trifluoropropylmethylsiloxane-(50%) dimethylsiloxane copolymer.

The precursor inlet system 13 is shown incorporated into the chamber through the chamber base plate 11. The thermocathode 2 comprises a resistively heated tungsten filament 4. Substrates 5 to be coated with the fluorine-doped diamond-like coating are attached to the substrate holder 6. The power supply 8 is used for biasing the substrates (DC or RF). In practice, the system is "pumped down" using normal vacuum pump down procedures. A gate valve (not shown) located on port 7 is closed and the system is backfilled with dry air, nitrogen, or argon until the chamber reaches atmospheric pressure. The door of the chamber, 9, is then opened and substrates to be coated 5 are attached to the substrate holder 6 using any of many possible methods (spring clip, screw, clamp, etc.). Special fixtures may be required for substrates of special shapes. The substrate holder is designed in a way that it will also hold a cylinder sample (not shown), which, in operation, rotates both about the axis of the central drive shaft 10, and its own axis which is perpendicular to 10. In this way, the axis of the cylinder would be perpendicular to the axis of 10.

When the substrates are loaded, the door of the chamber is closed, the chamber evacuated and the gate valve opened to bring system pressure down to at least $10^{-5}$ to $10^{-6}$ torr, which is the desired range of system base pressure. When the above base pressure is achieved, argon gas is introduced into the chamber via a needle valve or mass flow controller, until the chamber pressure reaches approximately $5\times10^{-5}$ to $1\times10^{-3}$ torr, preferably about $1-3\times10^{-4}$ torr. At this point the filament current, the filament bias and the electromagnet power supply are switched on. The filament current is the current that passes through the thermocathode (also called the filament or the cathode). The filament bias is the constant floating voltage applied to the filament (approximately −150V in relation to ground). Plasma current is measured as the current between the filament and the base plate or ground. This voltage provides the field that moves electrons emitted by the filament to the base plate 11. The electromagnet power supply provides current to the electromagnet, which creates a magnetic field that results in the electron path becoming a spiral, increasing the electron path length and improving the probability of collisions between the electrons and the vapor molecules created due to precursor evaporation. The substrate bias power supply is concurrently switched on.

Switching on these power supplies results in creation of an argon plasma, which is used to clean the substrates prior to deposition. After the required duration of cleaning, the precursor supply is opened. These precursors preferably have 1 to 10 silicon atoms. A preferred precursor is a fluorosilicone with poly-3, 3, 3-trifluoropropylmethylsiloxane-(50%) dimethylsiloxane co-polymer being particularly preferred. The precursor is introduced directly into the active plasma region using a microporous ceramic or metallic dispenser which is heated by the hot filament. The precursor can be mixed with other gases, both inert (argon as the feed gas) and active gases, including, but not limited to, methane, acetylene, and butane. The hot filament photon and electron emission causes fragmentation and ionization of the precursor.

Precursor flow is controlled via a needle valve and occurs due to the difference in pressure between the chamber and the outside atmosphere. When precursor flow and vaporization in the chamber has stabilized, the argon gas flow is turned off. The ionized precursor vapors form a stable plasma, ions from which are accelerated towards the substrate holder due to the substrate bias. Thus, deposition of fluorine-doped film occurs.

The precursor can also be introduced into the system using liquid-to-vapor delivery systems consisting of flow controller, a heater, and a dispenser as known in the field. The liquid-to-vapor delivery system is a conventional off-the-shelf component known in the field of vacuum technology. The precursor is stored in a reservoir and is delivered to a flash evaporator. The precursor is flash evaporated into a vapor. A mass flow controller is used to precisely control the flow rate of the precursor vapor. While not required, a mixing gas, such as argon can be used to assist precursor evaporation. In the case of liquid delivery systems, the source of electrons can be a hot filament isolated from the precursor delivery system.

The high vacuum is achieved by roughing down the chamber with a mechanical pump followed by pumping with a high vacuum pump. The pump can be a diffusion pump, turbomolecular pump, cryogenic pump, or other high vacuum pumps known in the field of vacuum technology. The coatings can be deposited in the process of the invention in a batch process for small volumes. In such instance, the substrates are mounted on a substrate holder inside the deposition chamber, the chamber is evacuated, the deposition is performed, and the chamber is vented, followed by removal of the coated substrates.

For larger volumes, the process of the present invention can be carried out in an air-to-air system. Such air-to-air system can consist of cleaning, transport of parts to the deposition chamber, and mechanized/robotic loading of the parts on the substrate holder. This is followed by entry of the substrate holder into the load-lock chamber, by entry into the deposition chamber, and coating. After coating, the substrate holder can then be removed from the deposition chamber into a load-lock chamber, followed by exit into the atmosphere. The substrates to be coated may be rotated, tilted, or otherwise oriented, or manipulated while on the substrate holder, and at other instances during processing.

The substrates may have to be rotated, tilted and vibrated during mounting on the substrate holder. Vertical orientation is preferred to minimize particulate or debris accumulation and contamination of substrate surfaces. The deposition chambers are evacuated with low turbulence vacuum pumping to minimize particulate and debris being deposited on the substrate surfaces.

The argon ion cleaning may also be accomplished by glow discharge cleaning. In glow discharge cleaning, the argon gas is introduced until the chamber pressure is in the $10^{-3}$ torr range. A glow discharge is excited by RF or DC. During the discharge, a substrate bias of from about 0.03 to about 5.0kV can be used. The frequency of the RF is in the range of 90–450 kHz.

Other ion sources known in the field of deposition coating, including, but not limited to, Kaufmann type ion sources, RF coil, and RF parallel plate can also be used for ion generation. A deposition system consisting of a Kaufmann ion source and a precursor liquid delivery system can be used to deposit these coatings on precision edges. The Kaufmann ion source ban be operated with an inert gas or the precursor gas. Preferably, the Kaufmann ion source is operated with an inert gas and the precursor gas is introduced into the deposition chamber separately. The Kaufmann ion source is operated at sufficiently high beam voltages such that there is increased bombardment resulting in a hard diamond-like coating. The Kaufmann ion source would be operated with a beam voltage in the range of 400 to 1500V, preferably in the range of 800 to 1200V. In addition to argon ion etching, other plasma cleaning can be performed by the introduction of small amounts of reactive gases such as oxygen gas with argon gas. The ion cleaning process has been found to efficiently remove hydrocarbon contamination, and other contaminants, as well as improve the adhesion of coatings deposited on substrates.

Co-deposition of the additional dopant material is carried out as follows. Argon flow to the magnetron is commenced and the magnetron 8 is switched on after the base pressure has been reached. A shutter 12 is used to prevent deposition while the substrate is cleaned via sputtering. When cleaning has been accomplished, the shutter 12 is opened and sputtering is carried out at the desired power level. This may occur prior to commencement of coating deposition, during coating deposition, after coating deposition, or intermittently during coating deposition, depending on what kind of coating structure and composition are desired. Using DC or RF sputtering, materials of all kinds (metals, ceramics, alloys, etc.) can be used for co-deposition.

Figure 3:
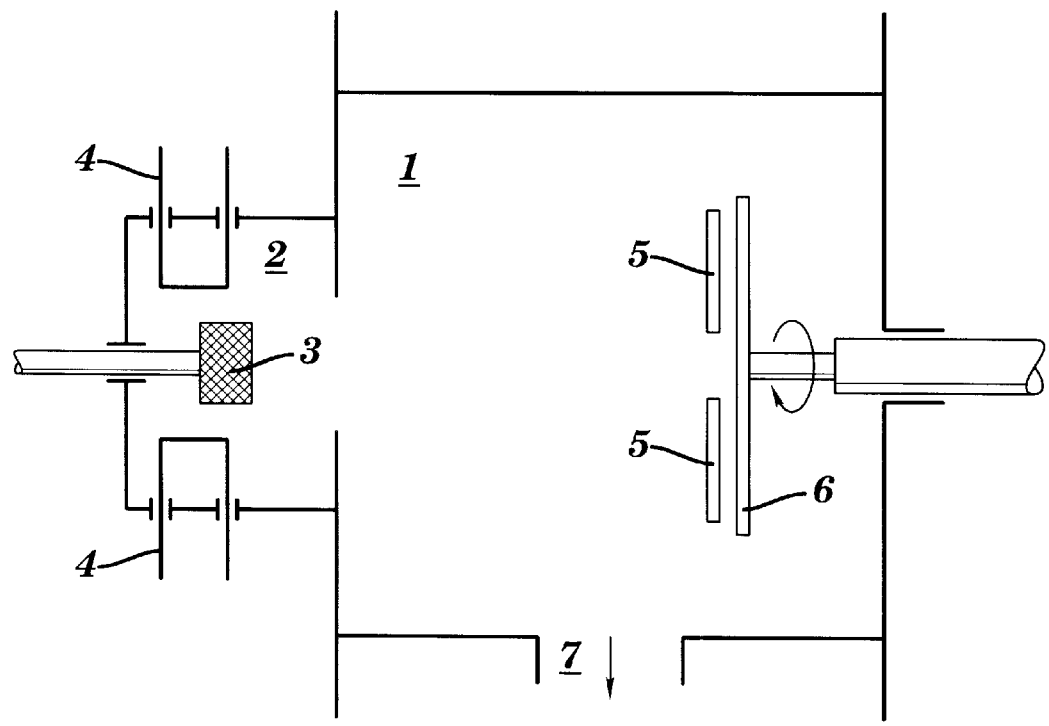
FIG. 3 is a cross section view of the deposition chamber for the deposition of the coatings.

The growth conditions for the coatings are the following, with reference to FIG. 3. The pressure in the deposition chamber 1 should not exceed $10^{-3}$ torr, with the pressure in the active zone of the plasma generation 2, in the range from about $1.0 \times 10^{-3}$ to about $5.0 \times 10^{-2}$ torr. The temperature of the substrate should not exceed about 200° C. with the temperature of the cathode filaments being in the range from about 2100 to about 2950° C. The current in the cathode filament is from about 70 to about 130 A, with the voltage across the filament being from about 20 to about 30 V. The voltage with respect to the ground is from about 70 to about 130 V with the plasma current being from about 0.5 to about 20.0 A. The voltage of the substrate holder is from about 0.1 to about 5.0 Kv, with all the carbon-containing and Si-containing species having kinetic energy in the range of from about 100 to about 1200 eV and from about 25 to about 300 eV respectively. The metal beams consist of free atoms or monatomic ions. The kinetic energy of the metal atoms/ions does not exceed from about 25 eV. With a precursor flow rate from about 0.5 to about 5.0 cc/hour, the growth rate of the coating is from about 0.1 to about 2.0 micrometers/hour.

The preferred range of operation for most applications is a pressure of about $1-3 \times 10^{-5}$ torr, a plasma current of about 1 amp., a filament current from about 60 to about 75 amp., a substrate voltage from about 600 to about 1000 V DC, or forward power of about 100 W in RF mode. The preferred frequency for RF mode is from about 90 to about 300 KHz. The preferred magnetron power depends on the type of material, composition and structure desired for the coating.

In a further preferred embodiment, a preferred method of deposition uses a plasma discharge in a triode plasmatron, as shown schematically in FIG. 3, with the plasma energy density above about 5 Kwh/gram-atom of carbon. The charged particles are extracted by a high voltage field in the vacuum chamber and directed onto the substrate. It is preferable that the potential of the substrate holder is from about −0.3 to about +5.0 Kv, and most preferably 1.0+/−0.2 Kv, and varying with a frequency in the range of from about 0 to about 25 Mhz for DC and from about 90 to about 300 KHz for RF. The ratio of the electron emission to the carbon precursor flow in the plasmatron is from about 0.5 to about 1.5 electrons per particle.

The formation of dopant-containing beams may be realized by any one of, or combination of, the following methods: 1) thermal evaporation; 2) ion-sputtering; and 3) ion beams. The dopant-containing beams are directed onto the growing coating surface through the vacuum chamber to exclude interparticle collisions in the deposition chamber itself. Substrates are placed in an adjacent chamber on a rotating substrate holder, (for example a drum) which ensures double rotary motion, said adjacent chamber being connected to the plasma generation chamber by an opening for the emission of the atomic or ionic beams, as shown schematically in FIG. 3. Alternatively, the plasma generation may be carried out within the chamber containing the substrates (FIG. 5). A DC or a radio frequency potential is generally applied to the substrates during the deposition process. No external substrate heating is required.

Useful variations of the above described methods for deposition of the fluorine-doped diamond-like coatings include, the use of sputtered silicon and oxygen gas as precursors for the Si and O, the use of solid $SiO_2$ as a source for Si and O, the use of $SiH_4$ and oxygen-containing gases as sources for Si and 0, the use of a graphite target, hydrogen, and fluorocarbon gases as sources of C, F and H, the use of metal-containing fluorosilicone compounds as sources of F, C, H, Si, O and metal, the use of metallo-organic compounds as a source of metal in conjunction with fluorosilicone compounds as a source of C, F, H, Si and O, the use of sputtered carbon and hydrogen or hydrocarbon gas as carbon and hydrogen precursors, the use of fluororganosilicon as fluorine precursors, or any combination thereof. The coating deposition can also be performed by a RF capacitively coupled discharge (CCD).

The fluorosilicone or other precursor can be introduced by either a separately heated microporous ceramic or metallic dispenser, or one of the liquid vapor injection systems described previously. The precursor can be mixed with other gases, both inert with argon as the feed gas, or active gases, including but not limited to methane, acetylene, and butane, to achieve deposition pressures typically in the $10^{-2}$ torr range. A single plate or parallel plate configuration can be used. The substrates are attached to one of the plates. RF or PDC voltage is then applied. In the case of a capacitive RF discharge, the frequency of the RF is in the range of 100 kHz to 100 Mhz. In another method, a large RF antenna can be placed inside the chamber to excite the discharge. The antenna can be made of copper, stainless steel, or other known state of the art materials. A protective coating, such as porcelain, can be applied to the surface of the antenna to prevent sputtering.

Figure 4:
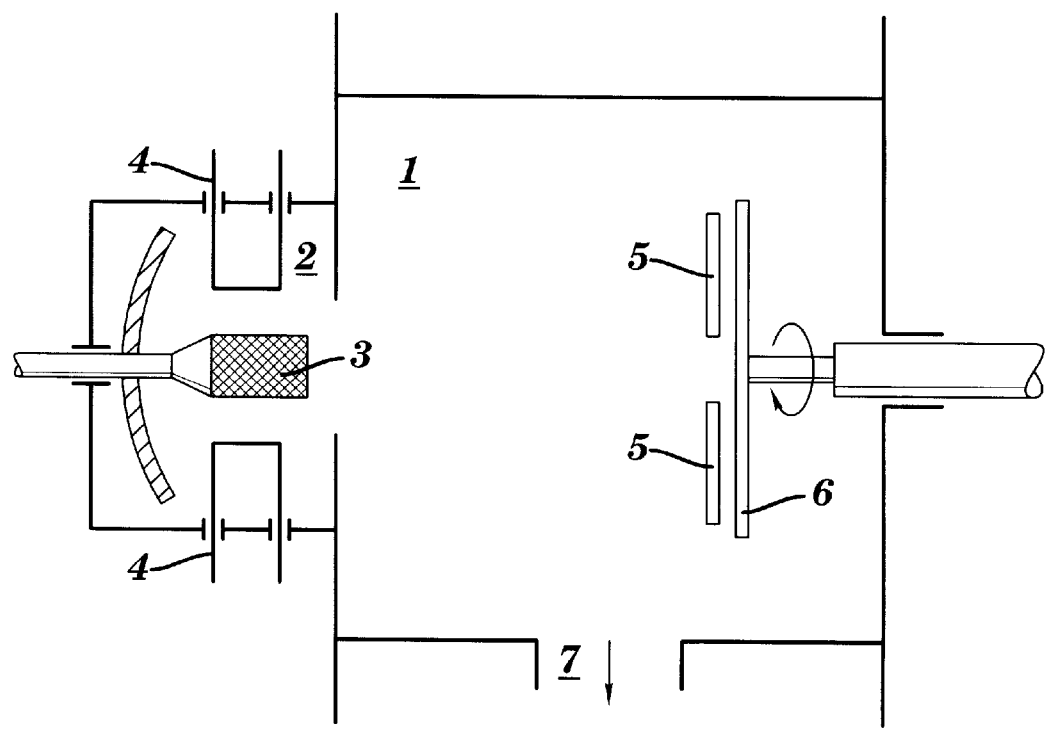
FIG. 4 is a cross section view of the deposition chamber for the deposition of coatings using a reflecting electrode.

For deposition on non-conducting substrates, such as plastic, a method whereby a flow of neutral radicals is reflected from a high voltage target and directed to the substrate as shown schematically in FIG. 4. The process employs depositions similarly to those shown in FIG. 3, except that a reflecting electrode is used to generate a neutral beam. This process eliminates surface damage of the substrate resulting from charged and/or fast particles impinging on the substrate during growth.

A preferred method for depositing ultra-thin dielectric coatings comprises ion bombardment (e.g. Ar+or K+with energy in the range of from about 30 to about 150 eV) through a vacuum chamber which has been backfilled by vapor (about $3 \times 10^{-4}$ torr). This results in a self-stabilized growth of a coating, with the maximum thickness controlled by the maximum tunneling distance for the relaxation of the charge of the absorbed radicals.

An optional method of depositing the coatings of the present invention is RF capacitive discharge.

In yet another preferred embodiment, the invention relates to a method for making a resistor which further includes depositing a diamond-like carbon, silicon, hydrogen, oxygen, fluorine, and metal-containing coating and patterning of the deposited coating as described in Example 18.

In another preferred embodiment, the invention relates to a method of making a capacitor which further includes depositing a metal bottom electrode, depositing a diamond-like carbon, silicon hydrogen, oxygen, and fluorine-containing coating and depositing a patterned top metal electrode. The metal bottom electrode could be metals such as Ti, Al, Cr, Mo, Ta, Ti/Pt/Ti or other electrode materials known in the state of the art. Top electrode materials could be Au, Ag, Al, Cu, Pt, Pd or other electrode materials known in the state of the art. Simple shadow masking or lithographic patterning as known in the state of the art can pattern the top metal electrode.

Extremely uniform and nonporous ultra-thin dielectric fluorine-doped diamond-like coatings may be deposited according to the present invention. The thickness of the deposited coating has no theoretical upper or lower limit. Existing technology and available equipment have allowed atomic-scale composite coatings and coating thicknesses typically in the range from about 1 μm to about 10 μm. For electrosurgical instruments, a coating thickness in the range from about 0.5 μm to about 5 μm is useful, with a preferred deposited coating thickness of from about 2 μm to about 3 μm. For flexible substrates, the coating thickness can range in thickness from 0.005 μm to 10 μm. The thickness of fluorine-doped diamond-like coating deposited to adequately protect a sharp edge will depend upon the nature of the substrate. Very small sharp blades may only require coatings from about 5 nm to about 150 nm, while other articles may require a protective fluorine-doped diamond-like coating which is several micrometers (microns) thick. Therefore, the above-described coatings of the present invention may be deposited on the selected precision-edged substrate, or on interlayers if desired, in thicknesses ranging from about 5 nm to about 12 μm, preferably from about 20 nm to about 12 μm, depending only on the desired application of the coated precision-edged substrate.

The following examples serve to further illustrate the present invention and should not be construed as limiting the invention.

EXAMPLES

Example 1

Deposition of Fluorine-Doped Diamond-Like Coatings on Razor Blades

One set of 2000 razor blades was coated on both sides with fluorine-doped diamond like coating. The razor blades were mounted on a steel fixture with the blade edges facing the deposition sources (the blades held parallel to the beam). Deposition was carried out at a pressure of $1.8 \times 10^{-4}$ torr, a plasma current of 1.0–1.1 amp., and a DC substrate bias of 630V. The deposition took place for 44 minutes. Shutters were used to shield the substrates during startup and shutdown of the plasmatron. At the deposition rate of 0.13 micrometers/hr, the test run resulted in a deposited coating thickness of 920 angstroms (0.092 micrometers) on a blade surface held flat facing the deposition beam. The thickness on the ultimate blade tip was approximately 300–500 angstroms.

Example 2

Deposition of Fluorine-Doped Diamond-Like Coatings on Razor Blades (Deposition Time of Twelve Minutes)

One set of 2000 razor blades was coated on both sides with fluorine-doped diamond-like coating. The razor blades were mounted on a steel fixture with blade edges facing the deposition sources. Deposition was carried out at a pressure of $1.5 \times 10^{-4}$ torr, a plasma current of 0.5 amp., and DC substrate bias of 570V. The deposition took place for 12 minutes at a deposition rate of 0.5 micrometers/hour. This resulted in a coating of 1060 angstroms thick on a flat surface. The thickness of the coating on the blade tip was approximately 350 to 550 angstroms. The coating exhibited a hardness of 6.5 GPa, as measured by nanoindentation.

Example 3

Deposition on Razor Blades of Fluorine-Doped Diamond-Like Coatings Containing an Additional Dopant Additional blades were coated with a fluorine-doped diamond-like coating, additionally doped with Titanium under the following chamber conditions. RF bias frequency was 200 KHz, the substrate bias was 350V, forward power was 65 to 80W, with titanium doping at from 10 to 20%. This resulted in a coating thickness of 750 angstroms on a flat surface. The hardness of the coating, as measured by nanoindentation, was 4.5 GPa.

Example 4

Wool Felt Shaving Test

The blades, coated according to the procedures in Examples 1–3, were tested by applying the blades against wool felt and shaving the felt 30 times (6 inches shave length). The blade edges were observed before and after the shaving test under an optical microscope. The coating exhibited good adhesion to the blade edges before and after the shaving test.

Example 5

Deposition of Fluorine-Doped Diamond-Like Coatings on Kapton® Film

A two by two square substrate of Kapton(t film was ultrasonically cleaned in cyclohexane, dried with nitrogen gas and mounted on a 24 inch substrate holder. Control samples of silicon, glass, carbon steel, stainless steel, and bare alumina substrates were cleaned in acetone, methylene chloride, methanol, were blow dried with Nitrogen gas, and were also mounted on the substrate holder. The chamber was evacuated to a ultimate pressure of $8 \times 10^{-5}$ torr. Argon gas was introduced in to the chamber to raise the pressure to $10^{-2}$ torr. The substrates were rotated at 7 revolutions per minute. An RF substrate bias was used and the substrate bias was ramped up to 350V. The substrates were argon ion-etched for 15 minutes at the above conditions. After 15 minutes of cleaning the pressure was lowered to $3.8 \times 10^{-4}$ torr. The triode plasmatron was ramped up to generate a plasma current of 1.0A. The poly-3, 3, 3-trifluoropropylmethylsiloxane-(50%) dimethylsiloxane co-polymer precursor was introduced directly into the plasma. The fluorine-doped diamond-like coating deposition was performed under the above conditions for 60 minutes. This resulted in a 0.5 micrometer thick, highly adherent coating on the substrate film. The fluorine-doped diamond-like coating exhibited a surface energy of 20.4 dyne/cm as measured by contact angle measurement. The control silicon substrates were used to measure the dielectric properties of the coating. The dielectric strength of the fluorine-doped diamond-like coating was greater than 1 MV/cm. The water contact angle for the fluorine-doped diamond-like coating was 91°.

Example 6

Deposition of Fluorine-Doped Diamond-Like Coatings on Metallized Ultem® Film

A two by two square substrate of metallized Ultem® film was mounted on a 24 inch substrate holder. Control samples of silicon, glass, carbon steel, stainless steel and bare alumina substrates were cleaned in acetone, methylene chloride, methanol and blow dried with nitrogen gas. The control samples were also mounted on the substrate holder. The substrates were shuttered. The chamber was evacuated to a ultimate pressure of $8 \times 10^{-5}$ torr. The triode plasmatron was ramped up to generate a plasma current of 1.0A. The poly-3, 3, 3-trifluoropropylmethylsiloxane-(50%) dimethylsiloxane co-polymer precursor was introduced directly into the plasma. After 15 minutes of stabilization the pressure was raised to $2 \times 10^{-4}$ torr. The substrates were rotated at 7 revolutions per minute. The substrate shutter was removed. A RF substrate bias was used and the substrate bias was ramped up to 110V. The fluorine-doped diamond-like coating deposition was performed under the above conditions for 15 minutes. This resulted in a 0.3 micrometer thick, highly adherent coating on the substrate film. The coating exhibited a surface energy of 22.5 dyne/cm as measured by contact angle measurement. The control silicon substrates were used to measure the dielectric properties of the coating. The dielectric strength of the fluorine-doped diamond-like coating was greater than 2MV/cm. The water contact angle for the fluorine-doped diamond-like coating was 81.5°.

Example 7

Deposition of Fluorine-Doped Diamond-Like Coatings on Metallized Kapton® Film A two by two square substrate of metallized Kapton® film was mounted on a 24 inch substrate holder. Control samples of silicon, glass, carbon steel, stainless steel and bare alumina substrates were cleaned in acetone, methylene chloride, methanol and blow dried with nitrogen gas. The control samples were also mounted on the substrate holder. The substrates were shuttered. The chamber was evacuated to a ultimate pressure of $8 \times 10^{-5}$ torr. The triode plasmatron was ramped up to generate a plasma current of 1.0A. The poly-3, 3, 3-trifluoropropylmethylsiloxane-(50%) dimethylsiloxane co-polymer precursor was introduced directly into the plasma. After 15 minutes of stabilization the pressure was raised to $2 \times 10^{-4}$ torr. The substrates were rotated at 7 revolutions per minute. The substrate shutter was removed. A RF substrate bias was used and the substrate bias was ramped up to 530V. The fluorine-doped diamond-like coating deposition was performed under the above conditions for 6 minutes. The chamber was vented to atmospheric pressure. The metallized Kaptong substrate was flipped so that the uncoated side could be coated. The second side was coated in a similar fashion. This resulted in a 0.15 micrometer thick, highly adherent fluorine-doped diamond-like coating on both sides of the metallized Kapton® film. The fluorine-doped diamond-like coating exhibited a surface energy of 20.9 dyne/cm as measured by contact angle measurement. The control silicon substrates were used to measure the dielectric properties of the coating. The dielectric strength of the fluorine-doped diamond-like coating was greater than 1MV/cm. The water contact angle for the fluorine-doped diamond-like coating was 93°.

Example 8

Deposition of Fluorine-Doped Diamond-Like Coatings on Metallized Silicon

A four inch diameter substrate of metallized silicon was mounted on a 24 inch substrate holder. Control samples of silicon, glass, carbon steel, stainless steel and bare alumina substrates were cleaned in acetone, methylene chloride, methanol and blow dried with nitrogen gas. The control samples were also mounted on the substrate holder. The substrates were shuttered. The chamber was evacuated to a ultimate pressure of $8 \times 10^{-5}$ torr. The triode plasmatron was ramped up to generate a plasma current of 1.0A. The poly-3, 3, 3-trifluoropropylmethylsiloxane-(50%) dimethylsiloxane co-polymer precursor was introduced directly into the plasma. After 15 minutes of stabilization the pressure was raised to $2 \times 10^{-4}$ torr. The substrates were rotated at 7 revolutions per minute. The substrate shutter was removed. A RF substrate bias was used and the substrate bias was ramped up to 108V. The fluorine-doped diamond-like coating deposition was performed under the above conditions for 18 minutes. This resulted in a 0.21 micrometer thick, highly adherent coating. The fluorine-doped diamond-like coating exhibited a surface energy of 22 dyne/cm as measured by contact angle measurement. The dielectric strength of the fluorine-doped diamond-like coating on the metallized silicon was 3.8 MV/cm.

Example 9

Comparison of Coatings Containing Carbon, Silicon, Hydrogen, and Oxygen, with a Coating Additionally Containing Fluorine This example was directed to a comparison of coatings containing carbon, silicon, hydrogen, and oxygen, with a coating additionally containing fluorine.

Several tribological properties of coated and uncoated materials can be determined using a pin-on-disk (POD) tribometer with two testing stations (systems 1 and 2) (Spire Inc). These properties include: coefficient of friction (COF), endurance, and wear factor.

Before proceeding with routine evaluations, a series of repeatability tests were conducted. The test conditions are listed in Table 1 below. This series of tests was conducted at ambient conditions. Three p-Si wafers were diced into ten (10), 1"×1" coupons prior to coating. All of the coupons were coated with a non-fluorine doped diamond-like coating, as described in U.S. Pat. No. 5,352,493, during a single run (#657). A polyphenylmethylsiloxane precursor (Gelest, Inc.) was used to deposit non-fluorine doped diamond-like coating. The thickness of the samples was 1.619 μm. After coating, the samples were placed in clean containers and exposed to ambient conditions for 8 hours. Adhesion was determined by a tape pull test and was performed on 2 coupons. Adhesion was excellent in all cases.

TABLE 1

| | | Coating Conditions | | | | | | |
|---|---|---|---|---|---|---|---|---|
| Sample | Press. × 10-4 | Precursor | Bias | Load/DC Power | Filament Bias | Plasma current | Dep. Time (min.) | Precursor flow |
| all samples | Torr 8.1 | Gelest | Volts 116 | Volts 65 | Volts 150 | Amps 1.02 | 180 | UPM 1.11 |

Next, tribological testing was conducted under a load of 5 N, at 225 RPM and for 10,000 revolutions in a POD tribometer. The ball/pin was ¼"-tungsten carbide and there was no lubrication. The Spire tribotester has 2 test arms which are completely independent. All of the samples except ff and fh were conducted in system 1. The results are shown in Table 2 below. The mean coefficient of friction (COF) was 0.17 for system 1 and 0.08 for system 2. The difference is believed to be a calibration error.

TABLE 2

Results of Repeatability Tests

Wear track area (mm$^2$)

| SAMPLE # | COF | A | B | C | D | Standard deviation | Coeff. of var. | Wear Rate (mm$^3$/Nm) |
|---|---|---|---|---|---|---|---|---|
| Fa | 0.17 | 3.80E-06 | 3.04E-06 | 1.28E-06 | 5.74E-06 | 1.85E-06 | 53% | 6.94E-08 |
| Fb | 0.17 | 2.49E-06 | 4.33E-06 | 5.01E-06 | 4.12E-06 | 1.07E-06 | 27% | 7.97E-08 |
| Fc | 0.17 | 1.67E-06 | 4.96E-06 | 1.86E-06 | 9.85E-06 | 1.77E-06 | 75% | 4.74E-08 |
| Fd | 0.17 | 2.99E-06 | 4.82E-06 | 1.95E-06 | 2.48E-06 | 1.24E-06 | 41% | 6.12E-08 |
| Fe | 0.16 | 3.77E-06 | 5.39E-06 | 6.76E-06 | 5.32E-06 | 1.22E-06 | 23% | 1.06E-07 |
| Fg | 0.18 | 3.14E-06 | 5.66E-06 | 4.11E-06 | 2.78E-06 | 1.29E-06 | 33% | 7.85E-08 |
| Fh | 0.09* | 6.19E-06 | 3.85F-06 | 4.84E-06 | 4.16E-06 | 1.04E-06 | 22% | 9.52E-08 |
| Ff | 0.08* | 2.07E-06 | 2.49E-06 | 1.93E-06 | 3.05E-06 | 5.02E-07 | 21% | 4.77E-08 |

*Samples evaluated in system 2

Deposition of Fluorine-Doped Diamond-Like Coating

Next, fluorine-doped diamond-like coatings were deposited on substrates. A hot-filament assisted plasma chemical vapor deposition (PACVD) process was utilized to deposit the fluorine-doped diamond-like coatings. A commercially-available organosilicon-based precursor which contains fluorine, specifically poly-3,3,3-trifluoropropylmethylsiloxane-(50%) dimethylsiloxane copolymer (Gelest, Inc., Tullytown, Pa.), was found to yield highly-adherent films with very low surface energies (~20 dynes/cm) and anti-icing property. Several deposition runs were completed. Coatings were performed on substrates such as silicon, carbon steel, stainless steel, aluminum, Teflon® fluorocarbon polymer, and titanium. Table 3 below lists the parameters and conditions utilized for the sample runs.

TABLE 3

Fluorine-Doped Diamond-Like Coating Run Conditions

| Run # | Press. × 10-4 Torr | Precursor | Load/DC Bias Volts | Power Watts | Filament bias Volts | Plasma current Amps | Dep. Time (min.) | Precursor flow (1 UPM = 0.12 cc/min) UPM |
|---|---|---|---|---|---|---|---|---|
| 695 | 2.26 | FMS-123 | 500.0 | 131.0 | 150 | 0.49 | 180 | 0.90 |
| 696 | 2.24 | FMS-123 | 600.0 | 181.0 | 150 | 0.53 | 180 | 1.00 |
| 697 | 2.01 | FMS-123 | 700.0 | 236.0 | 150 | 0.51 | 180 | 0.98 |
| 698 | 2.14 | FMS-221 | 500.0 | 135.0 | 150 | 0.49 | 120 | 1.22 |
| 699 | 2.11 | FMS-221 | 600.0 | 183.0 | 150 | 0.49 | 120 | 0.97 |
| 700 | 2.13 | FMS-221 | 700.0 | 239.0 | 150 | 0.52 | 120 | 0.97 |
| 701 | 2.01 | FMS-123 | 600.0 | 185.0 | 150 | 0.49 | 180 | 1.01 |

FMS-123: liquid poly-3,3,3-trifluoropropyl-methylsiloxane
FMS-221: liquid poly-3,3,3-trifluoropropyl-methylsiloxane-(50%) dimethylsiloxane copolymer

TABLE 4

Coating Properties

| Run # | Silicon Thick $\mu$m | Glass Thick $\mu$m | Silicon Deposition Rate $\mu$m/hr | Glass Deposition Rate $\mu$m/hr |
|---|---|---|---|---|
| 695 | 0.806 | 0.844 | 0.269 | 0.281 |
| 696 | 0.860 | 0.908 | 0.287 | 0.303 |
| 697 | 0.934 | 0.983 | 0.311 | 0.328 |
| 698 | 0.651 | 0.678 | 0.326 | 0.339 |
| 699 | 0.682 | 0.542 | 0.341 | 0.271 |
| 700 | 0.673 | 0.708 | 0.337 | 0.354 |
| 701 | 0.846 | 0.935 | 0.282 | 0.312 |

Anti-icing experiments

A qualitative icing test was performed on both fluorine-doped diamond-like coatings and non-doped diamond-like coatings (DLN).

A drop of tap water was placed on DLN and fluorine-doped diamond-like coated Si wafers. The samples were placed in a freezer (at 28° F.) for 1 hour to freeze the water droplet. The samples were removed and the droplet was removed. The effort required to remove the droplet was recorded. The frozen drop slid easily off the fluorine-doped diamond-like coating surface. In contrast, the ice stuck very well to DLN and eventually melted. Also, dipping the fluorine-doped diamond-like coated sample in water showed clearly how easily the water slid off of the fluorine-doped diamond-like coating, and when the coating was removed from the water, any residual water beads up (high contact angle).

Example 10

Characterization of Fluorine-Doped Diamond-Like Coatings

The evaluation of fluorinated films is presented in Table 5 below. The run conditions for the manufacture of the coatings is described above in Example 9.

TABLE 5

Film Properties of Fluorine-Doped Diamond-Like Coatings

| Sample | Thickness (μm) | Max Hardness (GPa) | Elastic Modulus (GPa) | Stress (MPa) |
|---|---|---|---|---|
| 695d | 0.806 | 10.5 | 86.3 | −233 |
| 696e | 0.860 | 11.0 | 90.8 | −262 |
| 697e | 0.692 | 10.2 | 79.7 | *** |
| 698d | 0.651 | 12.3 | 90.0 | −228 |
| 699f | 0.682 | 12.1 | 88.0 | −459 |
| 770d | 0.673 | 11.4 | 99.0 | −174 |
| 701d | 0.846 | 11.0 | 90.8 | −256 |

***sample broke accidentally

The hardness ranged from 10 to 12 GPa and the film stress ranged from −174 to −459 MPa. The coatings continued to exhibit low intrinsic film stresses with the addition of fluorine to the a-(C:H:Si:O) coating matrix. In comparison, the hardness of non-fluorine doped coatings ranged from about 6 to about 21 GPa and the elastic modulus was from about 60–220 GPa. The coating adhered well to a range of substrate materials, i.e., silicon, Teflon® fluorocarbon polymer, polyethylene, titanium, stainless steel, carbon steel, and aluminum. The combination of low stress and high elastic modulus contributed to this behavior.

These properties are important predictors of tribological performance. Many thin film coatings are susceptible to stress induced defects and cohesive failure under loading due to high intrinsic stresses, either tensile or compressive. Furthermore, the fluorine-doped diamond-like coatings were extremely smooth and replicated the surface features of the substrate. Surface morphology plays a critical role in the coefficient of friction, endurance, and failure mechanism hence inherently smooth films are desirable.

Example 11

Pin-On-Disk Measurements of Fluorine-Doped Diamond-Like Coated Substrates

The tribological properties of coated substrates were determined with pin-on disk (POD) testing. POD is very useful for benchmarking performance against uncoated parts and other coatings. The tests were run at a load of 5 N, at 225 RPM, with no lubrication, and in an ambient environment (30–50% RH). The ball was ¼"-tungsten carbide. Table 6 summarizes the friction coefficients (average) and wear factors of the coatings on silicon.

Silicon (100) was chosen because it is atomically smooth, very hard (H=13.3 GPa), and commonly used. Silicon is quite hard compared to either aluminum (H=0.1 to 1 GPa) or mild steel (H=3 to 4 GPa). Surface deformation of silicon was not a factor at the Hertzian pressures used in these tests. Applied loads of 10 N were attempted but the coating failed after less than 3,000 revolutions except in one case. Since the coatings were less than 1 μm thick, the applied pressure at 10 N was too great. At 5 N, the coatings did not fail except for two coatings. In one case, for example 2si0699e, the residual stress of the coating was a factor of two (2×) higher than the lowest stress coating.

TABLE 6

Friction and Wear Factors of Fluorine-Doped Diamond-Like Coatings

| Samples | Cycles | Coefficient of friction (COF) | Wear factor (mm³/Nm) |
|---|---|---|---|
| 695d | 10,000 | 0.157 | $4.48 \times 10^{-8}$ |
| 696e | 10,000 | 0.161 | $3.09 \times 10^{-8}$ |
| 697e | 5,113 | +++ | +++ |
| 698d | 10,000 | 0.124 | $1.83 \times 10^{-7}$ |
| 699f | 221 | +++ | +++ |
| 700d | 10,000 | 0.162 | $4.56 \times 10^{-8}$ |
| 701d | 15,000 | 0.163 | $8.80 \times 10^{-8}$ |

+++Film failed during testing

Figure 6:
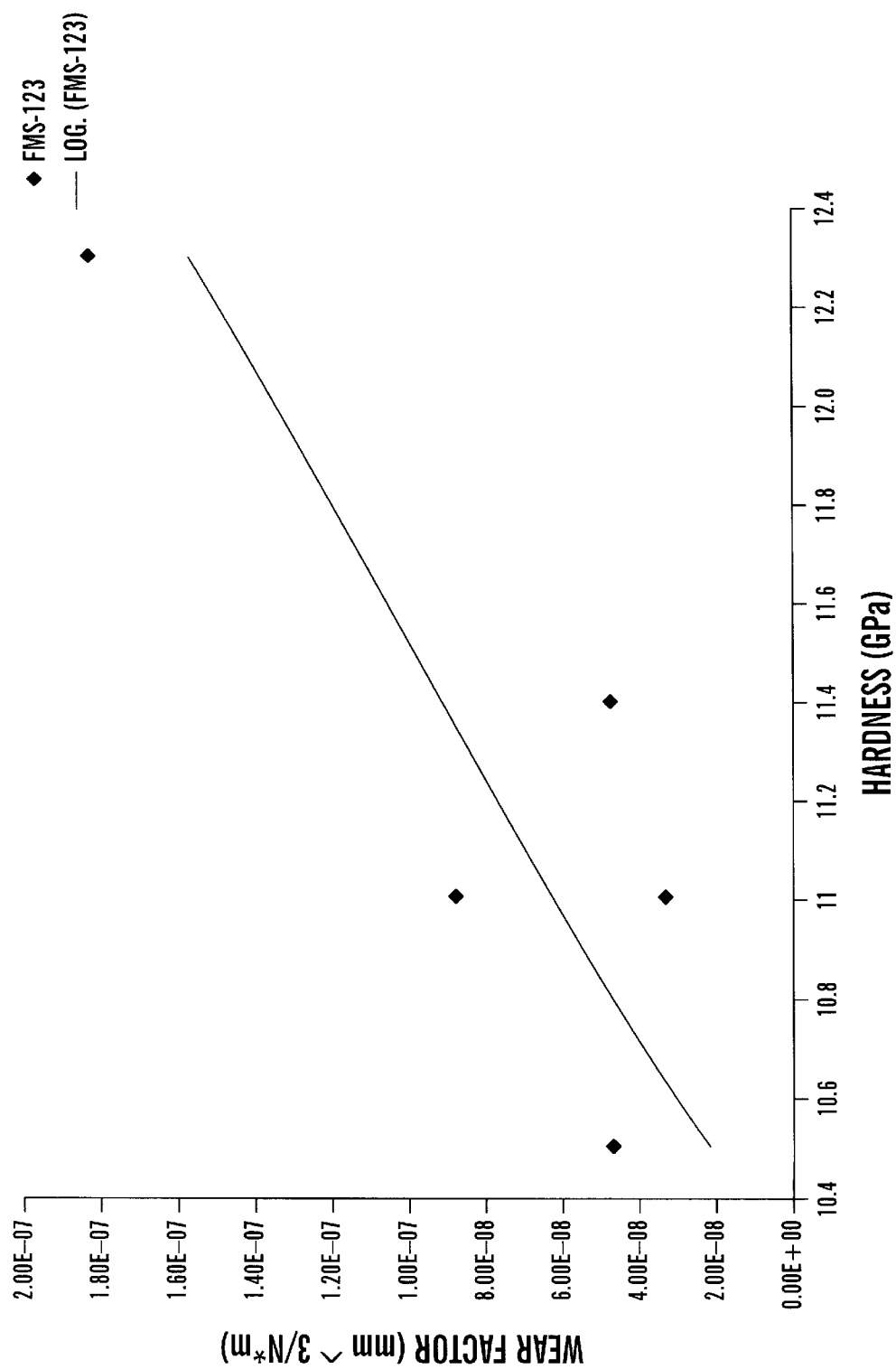
FIG. 6 is a plot of wear factor versus hardness for the fluorine-doped diamond-like coatings of the present invention.
Figure 7:
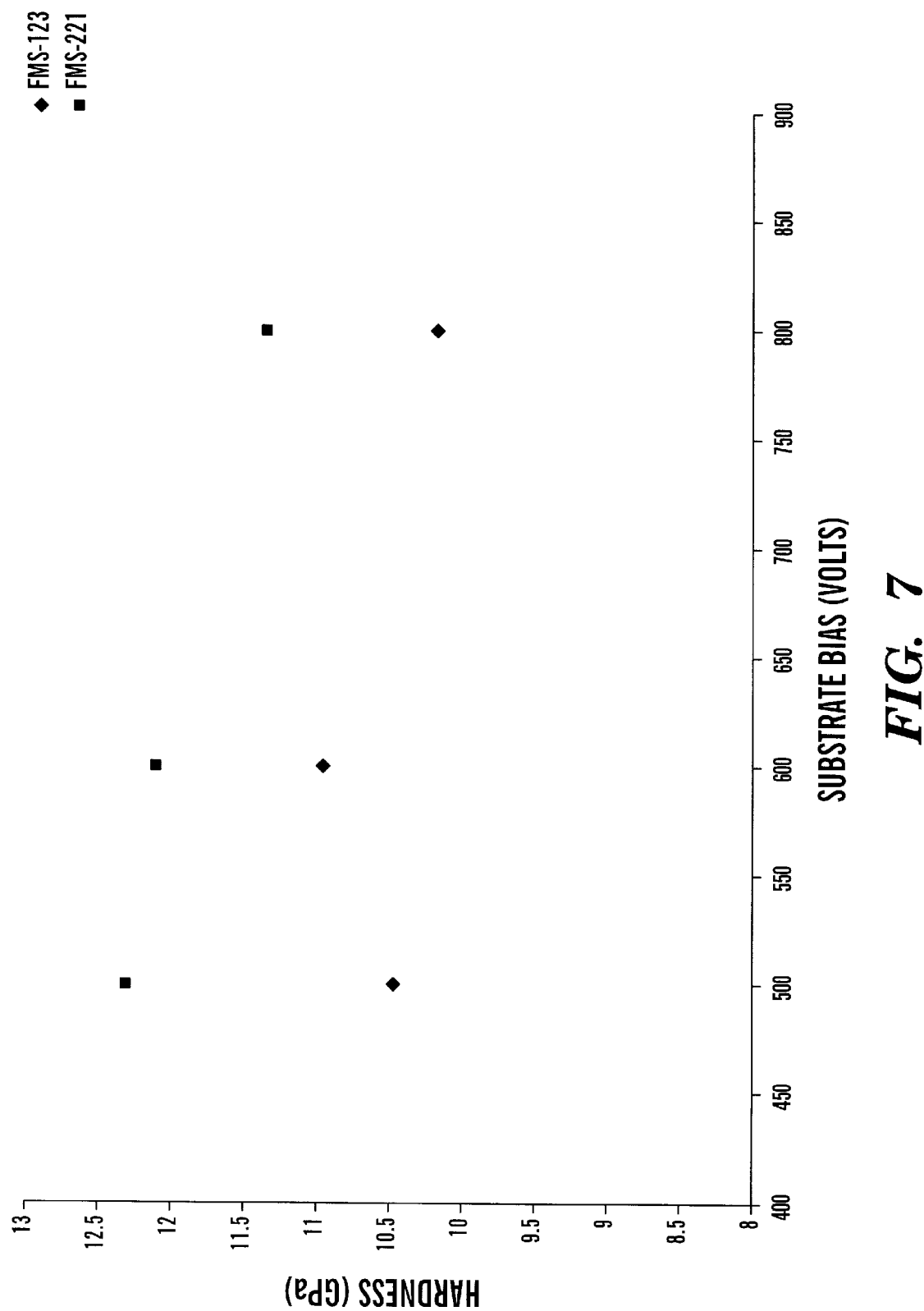
FIG. 7 is a plot of hardness versus bias for the fluorine-doped diamond-like coatings of the present invention.

The lowest wear factor was $3.09 \times 10^{-8}$ mm³/Nm which compares favorably with DLN ($5 \times 10^{-8}$ mm³/Nm, on average). Results of wear factor versus hardness and hardness versus bias for the fluorine-doped films are shown in FIGS. 6 and 7.

Example 12

Determination of the Atomic Concentration of Elements of a Fluorine-Doped Diamond-Like Coating A sample of a fluorine-doped diamond-like coating was produced as described above in Example 9. The sample was determined to have the following atomic concentration in wt.% as shown below in Table 7.

TABLE 7

Atomic Concentration (wt. %)

| Depth (Angstroms) | H | C | O | F | Si | Ar | W | Density |
|---|---|---|---|---|---|---|---|---|
| <2650 | 19.5 | 38.4 | 14.0 | 14.0 | 14.0 | 0.05 | 0.02 | 9.33E22 |
| 2650–3000 | 19.5 | 38.4 | 14.0 | 14.0 | 14.0 | 0.05 | 0.04 | 9.33E22 |
| 3000–3400 | 19.5 | 38.4 | 14.0 | 14.0 | 14.0 | 0.05 | 0.01 | 9.33E22 |
| 3400–3850 | 19.5 | 38.4 | 14.0 | 14.0 | 14.0 | 0.05 | 0.02 | 9.33E22 |
| >3850 | — | — | — | — | 100 | — | — | 5.00E22 |

Example 13

Manufacture of Fluorine-Doped Diamond-Like Coatings Additionally Containing a Metal Dopant Fluorine-doped diamond-like coatings were produced as described above in Example 9. The coatings were then doped with titanium and aluminum to vary the electrical resistivity from 1e+16 to 1e−01 ohm-cm. The exact atomic percentages were not measured. The surface energy of several fluorine-doped diamond-like coatings is shown in Table 8, wherein gamma c is the critical surface energy, gamma d is the dispersive component of surface energy, and gamma p is the polar component of surface energy. The coating impedance is shown in Table 9.

TABLE 8

Surface Energy of Fluorine-Doped Diamond-Like Coatings

| Sample | Coating Composition | Gamma c (dynes/cm) | Gamma p (dynes/cm) | Gamma d (dynes/cm) |
|---|---|---|---|---|
| 30580 | Ti:F-DLN | 25.6 | 8.3 | 26.7 |
| 30581 | Ti:F-DLN | 23.9 | 8.3 | 27.3 |
| 30582 | Ti-F-DLN | 24.4 | 8.7 | 24.8 |
| 30583 | Ti:F-DLN | 23.2 | 7.6 | 27.4 |
| 30584 | Ti:F-DLN | 21.9 | 6.2 | 25.3 |
| 30585 | Ti:F-DLN | 24.2 | 6.0 | 27.5 |
| 30591 | Ti:F--DLN | 25.8 | 13.3 | 26.5 |
| 30618 | Ti:F-DLN | 22.1 | 6.9 | 25.2 |
| 30620 | Ti:F--DLN | 23.0 | 9 | 24.7 |
| 30625 | Ti:F-DLN | 23.2 | 10.2 | 25.0 |
| 30627 | Al:F-DLN | 19.7 | 4.4 | 24.7 |
| 30628 | Al:F-DLN | 24.6 | 3.2 | 25.7 |
| 30631 | Ti:F-DLN | 21.2 | 6.3 | 26 |
| 30638 | Ti:F-DLN | 22.3 | | |
| 30641 | Ti:F-DLN | 22.5 | 5.2 | 25.2 |
| 30645 | Ti:F-DLN | 20.9 | 6.3 | |
| 30646 | Ti:F-DLN | 22.7 | 3.7 | |
| 30658 | Ti:F-DLN | 27 | 19.2 | 25.7 |
| 30659 | Ti:F-DLN | 20.4 | 19.2 | 25.7 |

TABLE 9

Selected Coating Impedances

| Sample | Impedance (ohm) |
|---|---|
| 30682 | <1 k |
| 30618 | 4 k |
| 30620 | 17M |

Environmental stability

Ti-DLN coatings (Sample nos: 3si0642 and 3si0641) deposited on silicon wafers (1"×3") were placed in a steam autoclave unit. The coatings were exposed to 250° F. for 100 minutes. No coating delamination was observed and coatings remained scratch resistant.

Example 14

Determination of Surface Energy of Fluorine-Doped Diamond-Like Coatings

Figure 8:
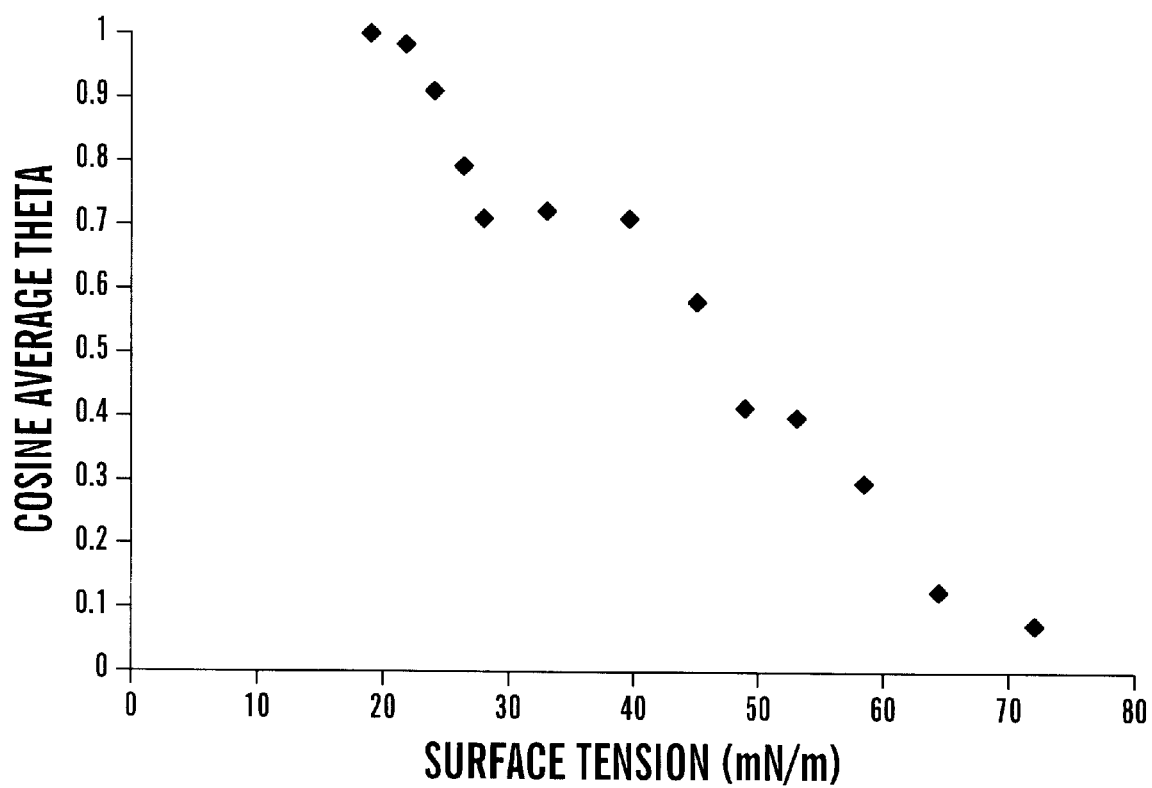
FIG. 8 is a plot showing surface energy for the fluorine-doped diamond-like coatings of the present invention.

The surface energy of a fluorine-doped diamond-like coating prepared as described above in Example 9 was measured and is shown in FIG. 8. $\gamma_c$ is the critical surface energy (1 mN/m is equal to 1 dyne/cm), $\gamma_d$ is the dispersive component of surface energy, $\gamma_p$ is the polar component of surface energy and $\gamma_c = \gamma_d + \gamma_p$.

Example 15

Determination of Electrical Parameters for A Metal-Insulator-Metal Heterostructure Design Using the Fluorine-Doped Diamond-Like Coatings A Metal-Insulator-Metal (MIM) multilayer design was utilized under this investigation for resistivity and dielectric measurements. MIMs were fabricated on aluminized glass substrates. The bottom metal layer was a continuous layer and served as a common electrode. The thickness of the bottom electrode was between 0.2 to 0.5 µm and was deposited by a magnetron sputtering. Metals such as Al, Cr, Ta, Mo and Au were used based on their ability to form stable, ohmic contacts with the fluorine-doped diamond-like coating. On top of the bottom electrode, a dielectric fluorine-doped diamond-like coating without an additional dopant was deposited, as a dielectric coating with hydrophobic properties. The fluorine-doped diamond-like coating layer was in the thickness range of 0.09 to 0.52 µm. Silver dots were made on top of the fluorine-doped diamond-like coating layer as the top electrode.

Electrodes wires were attached using silver paint and allowed to dry for 10 to 30 minutes. Current-voltage (I–V) testing of the fluorine-doped diamond-like coating capacitance structures were performed with a 6517 Keithly electrometer and Keithly model 8002a test fixture (Keithly Instruments, Inc., Cleveland, Ohio.). The Model 6517 is a 6½-digit electrometer/high resistance system with many measurement capabilities, including external temperature, external relative humidity, resistivity, voltage, and current measurements. The electrometer has femtoampere sensitivity and a built-in 1000V source. The Model 6517 can automatically implement a "Bias-Measure" sequence in which the test voltage is applied for a programmed time to permit current to reach equilibrium. Then at equilibrium the measurement can be made at some desired voltage. The test fixtures are guarded test fixtures for measuring surface and volume resisitivities and are designed to support the measurement capability of the Model 6517 Electrometer/High Resistance System. Model 8002 a allows measurement of resistances as high as $10^{15}$ ohms. From the current-voltage measurements at a nominal voltage of 5V the fluorine-doped diamond-like coating resistivity was determined. The leakage current was plotted as a function of increasing applied voltage to determine the breakdown characteristics of the fluorine-doped diamond-like coatings. For samples, 8 iterations of resistivity measurements were made and averaged. Table 10 lists the resistivity of some fluorine-doped diamond-like coatings deposited under this program, with corresponding thickness and % resistivity variation.

TABLE 10

Resistivity of Fluorine-Doped Diamond-Like Coatings Using MIM Structure

| Run Number | Film thickness, µm | Resistivity, ohm-cm | % variation |
|---|---|---|---|
| 645 | 0.14 | 1.25E+15 | 1.92 |
| 646 | 0.09 | 1.37E+15 | 0.82 |
| 653 | 0.45 | 8.06E+06 | 0.46 |
| 654 | 0.19 | 7.25E+11 | 2.89 |
| 655 | 0.16 | 2.58E+13 | 0.64 |
| 711 | 0.22 | 1.74E+15 | 0.98 |
| 717 | 0.26 | 2.28E+14 | 1.73 |

Most of the coatings exhibited resistivities above $10^{10}$ ohm-cm. Some of the coatings exhibited resistivities in the $10^{15}$ ohm-cm range. All the high resistivity films were also hydrophobic with water contact angles between 85 to 94°. Only one coating (run number 653) had a resistivity in the range of $10^6$ ohm-cm. This particular coating was deposited under different deposition conditions than the normal as an attempt to tailor the resistivity in the $10^{10}$ ohm-cm range.

The dielectric strength was measured from the current-voltage measurements as described above. The measurements were performed on sample areas in the range of 0.79 to 3.14 mm². Multiple measurements were made on the samples for consistency of data. The "Bias-Measure" sequence and an alternating polarity method were used for the measurements. Table 11 lists the dielectric strength of some fluorine-doped diamond-like coatings deposited under this program, with corresponding thickness and measurement area.

TABLE 11

Dielectric Strength of Fluorine-Doped Diamond-Like Coatings Using MIM Structure

| Run Number | Film Thickness ($\mu$m) | Area (mm$^2$) | $V_{br}$ (MV/cm) | Area (mm$^2$) | Vbr (MV/cm) |
|---|---|---|---|---|---|
| 645 | 0.14 | | | | |
| 646 | 0.09 | | | 3.14 | 1.07 |
| 653 | 0.45 | | | 3.14 | 0.40 |
| 654 | 0.19 | | | 3.14 | 0.68 |
| 655 | 0.16 | 0.78 | 6.31 | 3.14 | 3.19 |
| 711 | 0.22 | 1.77 | 4.60 | | |
| 717 | 0.26 | | | 3.14 | 2.92 |

Of the six coatings tested for dielectric strength, four of them exhibited dielectric strength above 1 MV/cm. Of those four, samples 655 and 711 exhibited dielectric strength in the 2.9 to 4.5 MV/cm range. However, sample 655 also shows the dependency of dielectric strength on the measurement area. This can be attributed to defects in the coating such as pinholes or particulates.

Measurements of fluorine-doped diamond-like coatings in the thickness range of 0.15 to 0.21 $\mu$m have yielded dielectric strengths as high as 3.8 MV/cm over slightly large areas (10 mm$^2$) and dissipation factor as low as 0.0040. The dielectric constant of the coatings is around 3.5, as determined by capacitance measurements. Capacitance measurements have also indicated that fluorine-doped diamond-like coatings are thermally stable with less than 1.5% variation over the temperature range of $-73°$ C. to $+177°$ C.

Example 16

Determination of Surface Energy/Water Contact Angle of Fluorine-Doped Diamond-Like Coatings The fluorine-doped diamond-like coatings were evaluated for surface energy and the water contact angle. For some applications, the coating must be hydrophobic. Hydrophobicity requires that the surface energy of the fluorine-doped diamond-like coating be very low and the water contact angle to be high. Balancing the forces acting on a water droplet we can write:

$$\gamma_s = \gamma_{s1} + \gamma_1 \cos\theta$$

Further, surface energy ($\gamma$) is composed of two components, namely the polar ($\gamma_p$) and dispersive ($\gamma^d$) components. Thus, $$\gamma = \gamma_p + \gamma_d$$

The surface energy and the contact angle measurements were conducted at the State University of New York at Buffalo.

Table 12 lists the contact angle and the surface energy values of fluorine-doped diamond-like coatings. The range of surface energy and water angles obtained was 20.4 to 24.4 dynes/cm and 83° to 98°. For all the water angle data reported here, the error is ±1°. Also, the water angle measurements indicate that the hydrophobic nature of the coating was exceptional, as contact angle could be measured easily and accurately. The water droplet beads up in a symmetrical fashion so that the contract angle is the same all around the water droplet.

TABLE 12

Tabulation of Surface Energy and Water Contact Angle of Fluorine-Doped Diamond-Like Coatings

| Run Number | Thickness, $\mu$m | Surface Energy ($\gamma$), dynes/cm | Polar Component ($\gamma_p$), dynes/cm | Water Angle |
|---|---|---|---|---|
| 645 | 0.14 | 20.9 | 6.3 | 85 |
| 646 | 0.09 | 22.7 | 3.7 | 94 |
| 653 | 0.45 | 24.2 | 4.3 | 95 |
| 654 | 0.19 | 21.2 | 2.7 | 98 |
| 657 | | 20.4 | 4.0 | 91 |
| 672 | 0.35 | 23.9 | 6.2 | 83 |
| 674 | 0.35 | 21.7 | 2.9 | 97 |
| 675 | 0.19 | 23.0 | 6.7 | 83 |
| 676 | 0.15 | 20.9 | 4.8 | 93 |
| 711 | 0.22 | 22.9 | 5.5 | 85 |
| 713 | 0.27 | 24.4 | 5.8 | 89 |

The polar component of the surface energy ($\gamma_p$) appears to be closely related to the water contact angle. The range of polar component obtained was 2.7 to 6.7 dynes/cm.

Example 17

Determination of Compatibility of Fluorine-Doped Diamond-Like Coatings With Polymeric Substrates Temperature Compatibility Very thin diaphragms of bare Kapton, metallized Kapton, metallized Ultem, and Ryton substrates were coated with fluorine-doped diamond-like coatings. None of the substrates were damaged during deposition as the depositions were done at low temperatures. This proves the temperature compatibility of the fluorine-doped diamond-like coating deposition process for polymeric substrates.

Adhesion

ASTM adhesion tests were performed on control samples of silicon and glass from each of the deposition runs. Some adhesion tests were performed on metallized Kapton samples also. These tests provide a qualitative ranking of the effectiveness of adhesion. Fluorine-doped diamond-like coatings were adhesion test D 3359-87. The adhesion test was performed on all the control samples. The results of the adhesion tests on the glass samples are tabulated in Table 13.

TABLE 13

Adhesion and Film Stress Results On Control Silicon and Glass Samples of Fluorine-Doped Diamond-Like Coatings

| Run Number | Adhesion | Compressive Stress, MPa |
|---|---|---|
| 645 | good | −40 |
| 646 | good | |
| 653 | gl-poor | |
| 654 | poor | −375 |
| 657 | good | |
| 672 | good | −321 |
| 674 | good | −282 |
| 675 | gl-poor | −326 |
| 676 | good | |
| 711 | good | −325 |
| 713 | good | −319 |
| 718 | good | −97 |
| 719 | good | −384 |

Example 18

Patterning of a Fluorine-Doped Diamond-Like Coating

The etching of fluorine-doped diamond-like coatings was investigated by reactive ion etching. One etch chemistry that can etch fluorine-doped diamond-like coatings involves the use of $CF_4$ with oxygen. At low power, oxygen addition has a negligible effect. At higher power levels the effect of oxygen addition becomes larger. At a power level of 100W (a reasonable power density of $32W/cm^2$), the maximum etch rate occurs around 15 sccm of oxygen. Without oxygen addition the etch rate of fluorine-doped diamond-like coatings is comparable to that of silicon dioxide under similar conditions. Different linewidth geometries were investigated. A linewidth of 1.5 micron can be achieved with very good resolution.

The etch rate of fluorine-doped diamond-like coatings in a pure oxygen, HCl and a photoresist asher was studied. The etch rate of fluorine-doped diamond-like coatings is less than 20 angstroms/minute in all cases. No steps were observed even after etching for one hour in some cases. This indicates that etching of fluorine-doped diamond-like coatings can be selective and etch chemistries used for metal and photoresist removal do not affect fluorine-doped diamond-like coatings.

Example 19

Electrosurgical Blades Coated with a Fluorine-Doped Diamond-Like Coating

Two stainless steel electrosurgical blades were ultrasonically cleaned in isopropyl alcohol and rinsed in deionized water to remove dirt and other gross contamination. The samples were dried at room temperature in air for approximately 30 minutes. The blades were mounted in an aluminum fixture with set screws. The fixture was affixed to stainless steel planetary fixtures, 30.48 cm (12 inches) in diameter. Silicon (100) and glass coupons were mounted alongside of the electrosurgical blade fixture. These coupons were cleaned in the same method as the electrosurgical blades. The coupons were 2.54 cm×2.54 cm. A longer coupon of silicon was included, 7.62 cm×2.54 cm to make a stress measurement. The stainless steel fixture was mounted in a 1 m×1 m×1 m stainless steel vacuum chamber. The vacuum chamber was pumped by a roots blower, a mechanical pump, and two diffusion pumps to a base pressure of $5.0\times10^{-6}$ mbar. The samples were rotated at 7 revolutions per minute to enhance deposition uniformity. The substrates were cleaned further with an argon glow discharge. Argon gas was admitted to the vacuum chamber until a pressure of $2.0\times10^{-4}$ mbar was achieved. Next, a tungsten filament was heated by an alternating current of 75.1 amps from a high current power supply. The filament reached temperatures in excess of 2100° C. during the run. A bias voltage of 150 Volts (direct current) was applied between the filament and the chamber which was at ground potential. A separate direct current power supply was used. Thermionic electrons were produced and an argon plasma discharge was created. A plasma current of 1.04 amps was measured on the filament bias power supply. A radio frequency bias of 315 volts was applied to the electrosurgical blades. A radio frequency generator operates at 200 kHz. The forward applied power was 80 Watts and the load power was 78 Watts. The electrosurgical blades were sputter-etched for 15 minutes. At the end of 15 minutes, the argon gas was turned-off and the deposition of the fluorine-doped diamond-like coating was started. The tungsten filament and bias were left on while the siloxane vapor (liquid poly-3,3,3-trifluoropropylmethylsiloxane or liquid poly-3,3,3-trifluoropropylmethylsiloxane-(50%) dimethylsiloxane copolymer) was introduced into the chamber at 0.04 sccm. The chamber pressure was maintained at $2.7\times10^{-4}$ mbar. The deposition was performed for 90 minutes. The samples cooled inside of the chamber for 30 minutes. The chamber was vented by introducing nitrogen gas into the chamber until atmospheric pressure, 1.013 mbar, was achieved. The samples and coupons were unloaded from the fixture. A dark black coating was observed on both the electrosurgical blades and coupons. This fluorine-doped diamond like coating on the electrosurgical blade was abrasion resistant. A sharp steel knife was run back and forth on the coating. The coating did not delaminate. A surface profilometer was used to measure the coating thickness on both the silicon and glass coupons. The measured thicknesses were 1.367 micron and 1.698 micron on the silicon and glass coupons, respectively. The calculated deposition rates were 0.911 micron/hour and 1.132 micron/hour on the silicon and glass coupons, respectively. The microhardness and elastic modulus of the coating was measured on a silicon coupon with a nanoindenter and was 12.4 GPa and 104.6 GPa, respectively. The stress was measured from the curvature on a 7.62 cm×2.54 cm silicon coupon. The stress was −636 MPa (compressive).

Example 20

Electrosurgical Blades Coated with a Fluorine-Doped Diamond-Like Coating Additionally Containing a Metal Dopant Fluorine-doped diamond-like coatings additionally containing a metal dopant were coated onto electrosurgical blades. The preferred additional metal dopant was titanium. In this embodiment, titanium was introduced into the fluorine-doped diamond-like coating by magnetron co-sputtering. Titanium is a biocompatible metal with sufficient resistivity (42 microhm-cm) to conduct radio frequency energy.

Prior to deposition, the electrosurgical blades were cleaned ultrasonically in a mild detergent and isopropyl alcohol for 15 minutes each. Between each step, the blades were rinsed in deionized water for 15 minutes to remove any residue. The blades were allowed to dry in air for approximately 20 minutes. The cleaned blades were mounted on a substrate platen. The substrate platen was biased during deposition. A radio frequency generator, 100-300 kHz, was used to apply a DC bias of between 300-800 Volts.

After the blades were loaded into the coating system, the chamber was evacuated to $1\times10^{-6}$ torr. The sequence of the process was as follows. Argon was introduced into the chamber and was primarily used as the sputtering gas. The flow rate of the argon was typically 16 standard cubic centimeters per minute (sccm). The total gas pressure was varied between $1\times10^{-4}$ to $1\times10^{-2}$ torr. The substrate platen was biased. Next, the titanium sputtering was initiated. Both direct current (DC) or pulsed direct current (PDC) generators were used to bias the magnetron target, titanium. The magnetron power was 1,500 Watts. A few seconds later, the hot-filament triode discharge was started. The tungsten filament was heated to incandescence by a 60 Hz power supply (14 Volts DC and 90 Amps). A DC bias of 150 Volts was applied to the filament to create a plasma discharge. Initially, argon was ionized. However, the fluorinated siloxane precursor, liquid poly-3,3,3-trifluoropropylmethylsiloxane-(50%) dimethylsiloxane (eFMS-221, Gelest, Pa.), was introduced into chamber. The fluorinated precursor was ionized and a volumetric glow discharge filled the chamber.

The typical impedance of these coatings varied from 50 to 200 ohm at 100 kHz. The surface energy remained low and varied from 25 to 29 mN/m. Optimum cutting performance was achieved at 25 mN/m. The data is presented in Table 14.

TABLE 14

Low Impedance, Low Surface Energy, Fluorine-Doped Diamond-Like Coatings on Electrosurgical blades.

| Coating Run # | Water Contact Angle (degree) | gamma (mN/m) | gamma p (mN/m) | gamma d (mN/m) | Impedance (ohm) |
|---|---|---|---|---|---|
| 1039 | 77 | 29 | 8 | 29 | 81.33 |
| 1023 | 82 | 27 | 8 | 28 | 39.08 |
| 1022 | 77 | 28 | 9 | 30 | 32.83 |
| 1021 | 88 | 28 | 5 | 28 | 13.50 |
| 1020 | 91 | 25 | 4 | 26 | 29.33 |
| 1019 | 88 | 27 | 5 | 28 | 30.42 |
| 1018 | 87 | 27 | 6 | 30 | 120.58 |
| 1016 | 88 | 28 | 6 | 28 | 108 |
| 1015 | 87 | 25 | 6 | 29 | 52 |
| 1014 | 91 | 26 | 6 | 28 | 196.58 |
| 1013 | 88 | 27 | 6 | 28 | 101.17 | gamma = composite surface free energy
gamma p = polar component of the composite surface free energy
gamma d = dispersion component of the composite surface free energy
Impedance: measured at 100 kHz Other embodiments of the aforementioned process are a filament-less discharge. This could utilize a hollow cathode, capacitively-coupled radio frequency, inductively-coupled radio frequency, or microwave plasma discharge. Titanium doping could be accomplished by thermal evaporation or e-beam evaporation. In addition, a titanium-doped siloxane could be utilized.

Although the invention has been described in detail for the purpose of illustration, it is understood that such detail is solely for that purpose, and variations can be made therein by those skilled in the art without departing from the spirit and scope of the invention which is defined by the following claims.

What is claimed:

1. An article comprising a substrate coated with a fluorine-doped coating, wherein said coating comprises a diamond-like composition comprised of carbon, silicon, oxygen, hydrogen, and fluorine and wherein the coating has a hardness of from about 5 to about 32 GPa and a surface energy of from about 19 to about 29 dyne/cm.

2. An article according to claim 1, wherein the coating is amorphous.

3. An article according to claim 1, wherein the carbon is bonded to hydrogen or fluorine.

4. An article according to claim 1, wherein the silicon is bonded to oxygen.

5. An article according to claim 1, wherein the fluorine-doped coating has a surface energy of from about 19.5 dyne/cm to about 26 dyne/cm.

6. An article according to claim 5, wherein the flexible substrate is a polymeric film.

7. An article according to claim 6, wherein the polymeric film is selected from the group consisting of polyimide, polyester, polythermide, polyamide-imide and polyethylene terephthalate films.

8. An article according to claim 7, wherein the fluorine-doped coating further comprises an additional dopant.

9. An article according to claim 8, wherein the additional dopant is selected from the group consisting of elements from groups Ib–VIIb and VIII of the periodic table.

10. An article according to claim 9, wherein the additional dopant is selected from the group consisting of B, Si, Ge, Te, O, Mo, W, Ta, Nb, Pd, Ir, Pt, V, Fe, Co, Mg, Mn, Ni, Ti, Zr, Cr, Re, Hf, Cu, Al, N, Ag and Au.

11. An article according to claim 10, wherein the additional dopant is titanium.

12. An article according to claim 5, wherein the fluorine-doped coating has a thickness from about 0.005 micrometers to about 10 micrometers.

13. An article according to claim 5, wherein the carbon, hydrogen, silicon, oxygen and fluorine are obtained from the decomposition of an organosiloxane having from about 1 to about 10 silicon atoms.

14. An article according to claim 13, wherein the organosiloxane is polytrifluoropropylmethylsiloxane.

15. An article according to claim 13, wherein the organosiloxane is poly-3,3,3-trifluoropropylmethylsiloxane-(50%) dimethylsiloxane copolymer.

16. An article according to claim 5, wherein the carbon content of the fluorine-doped coating is from about 40 wt. % to about 98 wt. %.

17. An article according to claim 5, wherein the carbon to silicon weight ratio of the fluorine-doped coating is from about 4:1 to about 9:1.

18. An article according to claim 5, wherein the silicon to oxygen weight ratio of the fluorine-doped coating is from about 0.6:1 to about 1.7:1.

19. An article according to claim 5, wherein the carbon content of the fluorine-doped coating is at least 40 atomic % of the fluorine-doped coating, the hydrogen content is up to about 40 atomic % of the carbon, and the sum of the silicon, oxygen and dopants together is greater than about 2 atomic % of the coating.

20. An article according to claim 5, wherein the fluorine-doped coating has a dielectric strength from about 1 MV/cm to about 4 MV/cm.

21. An article according to claim 5, wherein the fluorine-doped coating has a resistivity from about $10^{14}$ ohm-cm to about $10^{-2}$ ohm-cm.

22. An article according to claim 5, wherein the fluorine-doped coating has a surface energy from about 19.5 dyne/cm to about 26 dyne/cm.

23. An article according to claim 5, wherein the fluorine-doped coating has a water contact angle from about 80° to about 101°.

24. An article according to claim 1, wherein the substrate is a precision-edged substrate.

25. An article according to claim 24, wherein the precision-edged substrate comprises a metal.

26. An article according to claim 24, wherein the precision-edged substrate comprises a non-metal.

27. An article according to claim 24, wherein the substrate is selected from the group consisting of industrial tools, surgical instruments, knives and razors.

28. An article according to claim 27, wherein the substrate is a razor blade.

29. An article according to claim 24, wherein the fluorine-doped coating further comprises an additional dopant.

30. An article according to claim 29, wherein the additional dopant is selected from the group consisting of elements from groups Ib–VIIb and VIII of the periodic table.

31. An article according to claim 30, wherein the additional dopant is selected from the group consisting of B, Si, Ge, Te, O, Mo, W, Ta, Nb, Pd, Ir, Pt, V, Fe, Co, Mg, Mn, Ni, Ti, Zr, Cr, Re, Hf, Cu, Al, N, Ag, and Au.

32. An article according to claim 24, wherein the fluorine-doped coating is deposited on the substrate to a thickness from about 5 nm to about 12 micrometers.

33. An article according to claim 24, wherein the coating is deposited on the substrate to a thickness from about 5 nm to about 150 nm.

34. An article according to claim 24, wherein the fluorine-doped coating is deposited directly into the substrate without an interlayer.

35. An article according to claim 24, wherein the carbon, hydrogen, silicon, oxygen and fluorine are obtained from the decomposition of an organosiloxane having from about 1 to about 10 silicon atoms.

36. An article according to claim 35, wherein the organosiloxane is polytrifluoropropylmethylsiloxane.

37. An article according to claim 35, wherein the organosiloxane is poly-3,3,3-trifluoropropylmethylsiloxane-(50%) dimethylsiloxane copolymer.

38. An article according to claim 24, wherein the carbon content of the fluorine-doped coating is from about 40 wt. % to about 98 wt. %.

39. An article according to claim 24, wherein the carbon to silicon weight ratio of the fluorine-doped coating is from about 2:1 to about 8:1.

40. An article according to claim 24, wherein the silicon to oxygen weight ratio of the fluorine-doped coating is from about 0.5:1 to about 3:1.

41. An article according to claim 24, wherein the carbon content of the fluorine-doped coating is at least 40 atomic % of the fluorine-doped coating, the hydrogen content is up to about 40 atomic % of the carbon, and the sum of the silicon, oxygen and dopants together is greater than about 2 atomic % of the coating.

42. An article according to claim 24, wherein the fluorine-doped coating has a resistivity from about $10^{14}$ ohm-cm to about $10^{-2}$ ohm-cm.

43. An article according to claim 24, wherein the fluorine-doped coating has a water contact angle from about 80° to about 101°.

44. An article according to claim 1, wherein the substrate is an electrosurgical instrument.

45. An article according to claim 44, wherein the electrosurgical instrument is selected from the group consisting of electrosurgical blades, bipolar forceps, laparoscopic instruments, dental brackets, and biomedical devices.

46. An article according to claim 44, wherein the electrosurgical instrument is a precision-edged substrate.

47. An article according to claim 44, wherein the fluorine-doped coating further comprises an additional dopant.

48. An article according to claim 47, wherein the additional dopant is selected from the group consisting of elements from groups Ib–VIIb and VIII of the periodic table.

49. An article according to claim 48, wherein the additional dopant is selected from the group consisting of B, Li, Na, Si, Ge, Te, O, Mo, W, Ta, Nb, Pd, Ir, Pt, V, Fe, Co, Mg, Mn, Ni, Ti, Zr, Cr, Re, Hf, Cu, Al, N, Ag, Au, TiN, BN, AlN, ZrN and CrN.

50. An article according to claim 44, wherein the fluorine-doped coating is deposited to a thickness from about 0.5 $\mu$m to about 5 $\mu$m.

51. An article according to claim 44, wherein the fluorine-doped coating is deposited to a thickness from about 2 $\mu$m to about 3 $\mu$m.

52. An article according to claim 44, wherein the carbon, hydrogen, silicon and oxygen are obtained from the decomposition of an organosiloxane having from about 1 to about 10 silicon atoms.

53. An article according to claim 52, wherein the organosiloxane is polytrifluoropropylmethylsiloxane.

54. An article according to claim 52, wherein the organosiloxane is poly-3,3,3-trifluoropropylmethylsiloxane-(50%) dimethylsiloxane copolymer.

55. An article according to claim 44, wherein the carbon content of the fluorine-doped coating is from about 40 wt. % to about 98 wt. %.

56. An article according to claim 44, wherein the carbon to silicon weight ratio of the fluorine-doped coating is from about 2:1 to about 8:1.

57. An article according to claim 44, wherein the silicon to oxygen weight ratio of the fluorine-doped coating is from about 0.5:1 to about 3:1.

58. An article according to claim 44, wherein the carbon content of the fluorine-doped coating is at least 40 atomic % of the fluorine-doped coating, the hydrogen content is up to about 40 atomic % of the carbon, and the sum of the silicon, oxygen and dopants together is greater than about 2 atomic % of the coating.

59. An article according to claim 44, wherein the article has an impedance from about 1 ohm to about 1000 ohms.

60. An article according to claim 44, wherein the fluorine-doped coating has a resistivity from about $10^{-2}$ ohm-cm to about $10^{15}$ ohm-cm.

61. An article according to claim 44, wherein the fluorine-doped coating has a water contact angle from about 80° to about 101°.

* * * * *